(12) United States Patent
Arghavani et al.

(10) Patent No.: US 9,153,486 B2
(45) Date of Patent: Oct. 6, 2015

(54) CVD BASED METAL/SEMICONDUCTOR OHMIC CONTACT FOR HIGH VOLUME MANUFACTURING APPLICATIONS

(71) Applicant: Lam Research Corporation, Fremont, CA (US)

(72) Inventors: Reza Arghavani, Scotts Valley, CA (US); Jeffrey Marks, Saratoga, CA (US); Benjamin A. Bonner, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/862,048

(22) Filed: Apr. 12, 2013

(65) Prior Publication Data

US 2014/0308812 A1    Oct. 16, 2014

(51) Int. Cl.
  *H01L 21/768* (2006.01)
(52) U.S. Cl.
  CPC .................................. *H01L 21/7688* (2013.01)
(58) Field of Classification Search
  None
  See application file for complete search history.

(56) References Cited

U.S. PATENT DOCUMENTS

| | | | |
|---|---|---|---|
| 4,746,375 A | 5/1988 | Iacovangelo | |
| 4,804,560 A | 2/1989 | Shioya et al. | |
| 4,874,719 A | 10/1989 | Kurosawa | |
| 4,962,063 A * | 10/1990 | Maydan et al. | 438/699 |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |

(Continued)

FOREIGN PATENT DOCUMENTS

| | | |
|---|---|---|
| EP | 0 437 110 | 7/1991 |
| EP | 1 156 132 | 11/2001 |

(Continued)

OTHER PUBLICATIONS

Manik. P, et al. Fermi-level unpinning and low resistivity in contacts to n-type Ge with a thin ZnO interfacial layer, App. Phys. Lett. 101, 182105 (2012).*

(Continued)

*Primary Examiner* — Charles Garber
*Assistant Examiner* — Alia Sabur
(74) *Attorney, Agent, or Firm* — Weaver Austin Villeneuve & Sampson LLP

(57) ABSTRACT

An apparatus and method for manufacturing an interconnect structure to provide ohmic contact in a semiconductor device is provided. The method includes providing a semiconductor device, such as a transistor, comprising a substrate, a gate dielectric, a gate electrode, and source and drain regions in the substrate. An ultra-thin interfacial dielectric is deposited by chemical vapor deposition (CVD) over the source and drain regions, where the interfacial dielectric can have a thickness between about 3 Å and about 20 Å. The ultra-thin interfacial dielectric is configured to unpin the metal Fermi level from the source and drain regions. Other steps such as the deposition of a metal by CVD and the cleaning of the substrate surface can be performed in an integrated process tool without a vacuum break. The method further includes forming one or more vias through a pre-metal dielectric over the source and drain regions of the substrate.

25 Claims, 14 Drawing Sheets

(56) References Cited

U.S. PATENT DOCUMENTS

| | | | |
|---|---|---|---|
| 5,391,394 A | 2/1995 | Hansen | |
| 5,567,583 A | 10/1996 | Wang et al. | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,926,720 A | 7/1999 | Zhao et al. | |
| 5,956,609 A | 9/1999 | Lee et al. | |
| 5,963,833 A | 10/1999 | Thakur | |
| 5,994,749 A * | 11/1999 | Oda | 257/411 |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,355,254 B2 * | 4/2008 | Datta et al. | 257/382 |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0037630 A1 | 3/2002 | Agarwal et al. | |
| 2002/0090796 A1 | 7/2002 | Desai et al. | |
| 2002/0117399 A1 | 8/2002 | Chen et al. | |
| 2002/0132472 A1 | 9/2002 | Park | |
| 2002/0155722 A1 | 10/2002 | Satta et al. | |
| 2002/0168840 A1 | 11/2002 | Hong et al. | |
| 2002/0177316 A1 | 11/2002 | Miller et al. | |
| 2003/0059980 A1 | 3/2003 | Chen et al. | |
| 2003/0091870 A1 | 5/2003 | Bhowmik et al. | |
| 2003/0104126 A1 | 6/2003 | Fang et al. | |
| 2003/0123216 A1 | 7/2003 | Yoon et al. | |
| 2003/0127043 A1 | 7/2003 | Lu et al. | |
| 2003/0129828 A1 | 7/2003 | Cohen et al. | |
| 2003/0190802 A1 | 10/2003 | Wang et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0151845 A1 | 8/2004 | Nguyen et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2005/0179141 A1 | 8/2005 | Yun et al. | |
| 2005/0191803 A1 | 9/2005 | Matsuse et al. | |
| 2006/0003581 A1 | 1/2006 | Johnston et al. | |
| 2006/0075966 A1 | 4/2006 | Chen et al. | |
| 2006/0094238 A1 | 5/2006 | Levy et al. | |
| 2006/0145190 A1 * | 7/2006 | Salzman et al. | 257/192 |
| 2006/0211244 A1 * | 9/2006 | Deshpande et al. | 438/682 |
| 2006/0284317 A1 | 12/2006 | Ito et al. | |
| 2007/0087560 A1 | 4/2007 | Kwak et al. | |
| 2007/0099420 A1 | 5/2007 | Dominquez et al. | |
| 2007/0190780 A1 | 8/2007 | Chung et al. | |
| 2008/0045010 A1 | 2/2008 | Wongsenakhum et al. | |
| 2008/0081127 A1 | 4/2008 | Thompson et al. | |
| 2008/0081453 A1 | 4/2008 | Kim et al. | |
| 2008/0124926 A1 | 5/2008 | Chan et al. | |
| 2008/0254619 A1 | 10/2008 | Lin et al. | |
| 2008/0254623 A1 | 10/2008 | Chan et al. | |
| 2008/0280438 A1 | 11/2008 | Lai et al. | |

(56) References Cited

U.S. PATENT DOCUMENTS

| | | | |
|---|---|---|---|
| 2009/0045517 A1 | 2/2009 | Sugiura et al. | |
| 2009/0053893 A1 | 2/2009 | Khandelwal et al. | |
| 2009/0149022 A1 | 6/2009 | Chan et al. | |
| 2009/0160030 A1 | 6/2009 | Tuttle | |
| 2009/0163025 A1 | 6/2009 | Humayun et al. | |
| 2009/0315154 A1 | 12/2009 | Kirby et al. | |
| 2010/0035427 A1 | 2/2010 | Chan et al. | |
| 2010/0055904 A1 | 3/2010 | Chen et al. | |
| 2010/0130002 A1 | 5/2010 | Dao et al. | |
| 2010/0130003 A1 | 5/2010 | Lin et al. | |
| 2010/0155846 A1* | 6/2010 | Mukherjee et al. | 257/365 |
| 2010/0159694 A1 | 6/2010 | Chandrashekar et al. | |
| 2010/0244141 A1* | 9/2010 | Beyer et al. | 257/369 |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2010/0330800 A1 | 12/2010 | Ivanov et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2011/0233778 A1 | 9/2011 | Lee et al. | |
| 2011/0236594 A1* | 9/2011 | Haverkamp et al. | 427/553 |
| 2012/0009785 A1 | 1/2012 | Chandrashekar et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |
| 2012/0231626 A1 | 9/2012 | Lee et al. | |
| 2012/0244699 A1 | 9/2012 | Khandelwal et al. | |
| 2012/0294874 A1 | 11/2012 | Macary et al. | |
| 2013/0062677 A1 | 3/2013 | Li et al. | |
| 2013/0109172 A1 | 5/2013 | Collins et al. | |
| 2013/0168864 A1 | 7/2013 | Lee et al. | |
| 2013/0171822 A1 | 7/2013 | Chandrashekar et al. | |
| 2013/0302980 A1 | 11/2013 | Chandrashekar et al. | |
| 2014/0011358 A1 | 1/2014 | Chen et al. | |
| 2014/0027664 A1 | 1/2014 | Wei et al. | |
| 2014/0030889 A1 | 1/2014 | Chen et al. | |
| 2014/0061931 A1 | 3/2014 | Kang | |
| 2014/0073135 A1 | 3/2014 | Guan et al. | |
| 2014/0154883 A1 | 6/2014 | Humayun et al. | |
| 2014/0162451 A1 | 6/2014 | Chen et al. | |

FOREIGN PATENT DOCUMENTS

| | | |
|---|---|---|
| EP | 1 179 838 | 2/2002 |
| JP | 08-115984 | 5/1996 |
| JP | 09-027596 | 1/1997 |
| JP | H10-144688 | 5/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-540123 | 11/2009 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 705936 | 4/2007 |
| KR | 10-2008-0036679 | 4/2008 |
| KR | 10-2008-0110897 | 12/2008 |
| KR | 10-2009-0103815 | 10/2009 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148444 | 10/2013 |
| WO | WO 2013/148880 | 10/2013 |

OTHER PUBLICATIONS

U.S. Appl. No. 14/135,375, filed Dec. 19, 2013, entitled "Method for Depositing Extremely Low Resistivity Tungsten."

U.S. Appl. No. 13/758,928, filed Feb. 4, 2013, entitled "Methods for Forming All Tungsten Contacts and Lines." [NOVLP244C2/NVLS003350C2].

US Office Action, dated Apr. 7, 2014, issued in U.S. Appl. No. 13/633,502.

US Office Action, dated Jul. 17, 2002, issued in U.S. Appl. No. 09/975,074.

US Notice of Allowance, dated Mar. 12, 2003, issued in U.S. Appl. No. 09/975,074.

US Office Action, dated Feb. 8, 2005, issued in U.S. Appl. No. 10/649,351.

US Final Office Action, dated Jul. 14, 2005, issued in U.S. Appl. No. 10/649,351.

US Office Action, dated Dec. 30, 2005, issued in U.S. Appl. No. 10/649,351.

US Notice of Allowance, dated Jul. 21, 2006, issued in U.S. Appl. No. 10/649,351.

US Office Action, dated Jun. 22, 2004, issued in U.S. Appl. No. 10/435,010.

US Notice of Allowance, dated Oct. 7, 2004, issued in U.S. Appl. No. 10/435,010.

US Notice of Allowance, dated Jan. 19, 2005, issued in U.S. Appl. No. 10/435,010.

US Office Action, dated Nov. 23, 2005, issued in U.S. Appl. No. 10/984,126.

US Final Office Action, dated May 17, 2006, issued in U.S. Appl. No. 10/984,126.

US Notice of Allowance, dated Aug. 25, 2006, issued in U.S. Appl. No. 10/984,126.

US Office Action, dated Mar. 23, 2005, issued in U.S. Appl. No. 10/690,492.

US Notice of Allowance, dated Sep. 14, 2005, issued in U.S. Appl. No. 10/690,492.

US Office Action, dated Jun. 27, 2008, issued in U.S. Appl. No. 11/305,368.

US Office Action, dated Apr. 3, 2009, issued in U.S. Appl. No. 11/305,368.

US Notice of Allowance, dated Nov. 17, 2009, issued in U.S. Appl. No. 11/305,368.

US Office Action, dated Jul. 12, 2005, issued in U.S. Appl. No. 10/815,560.

US Final Office Action, dated Dec. 28, 2005, issued in U.S. Appl. No. 10/815,560.

US Office Action, dated Apr. 17, 2006, issued in U.S. Appl. No. 10/815,560.

US Office Action, dated Sep. 28, 2006, issued in U.S. Appl. No. 10/815,560.

US Notice of Allowance dated Apr. 24, 2007, issued in U.S. Appl. No. 10/815,560.

US Office Action, dated Aug. 21, 2008, issued in U.S. Appl. No. 11/265,531.

(56) References Cited

OTHER PUBLICATIONS

US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Final Office Action, dated Jul. 2, 2014, issued in U.S. Appl. No. 13/020,748.
US Office Action, dated Jun. 20, 2013, issued in U.S. Appl. No. 13/560,688.
US Final Office Action, dated Feb. 14, 2014, issued in U.S. Appl. No. 13/560,688.
US Office Action, dated Jun. 14, 2013, issued in U.S. Appl. No. 13/633,798.
US Final Office Action, dated Nov. 26, 2013, issued in U.S. Appl. No. 13/633,798.
US Notice of Allowance, dated May 23, 2014, issued in U.S. Appl. No. 13/633,798.

(56) References Cited

OTHER PUBLICATIONS

PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Chinese Third Office Action dated Apr. 22, 2014 issued in Application No. 200980133560.1.
Japanese Office Action dated Dec. 3, 2013 issued in Application No. 2011-525228.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Jun. 17, 2014 issued in Application No. 10-2013-7027117.
Japanese Office Action dated Jun. 17, 2014 issued in Application No. JP 2010-055163.
Korean Office Action dated Mar. 21, 2013 issued in KR Application No. 10-2010-0024905.
Korean Notification of Provisional Rejection dated Jul. 17, 2012, issued in Application No. 2010-0087997.
Japanese Office Action dated Mar. 4, 2014 issued in JP 2010-093522.
Korean Office Action dated Mar. 4, 2013 in KR Application No. 2010-0035449.
Japanese Office Action dated Jul. 29, 2014 issued in JP 2010-093544.
Korean Second Office Action dated Jan. 25, 2014 in KR Application No. 10-2010-0035453.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Collins et al. (Jan. 21, 2003) "Pulsed Deposition of Ultra Thin Tungsten for Plugfill of High Aspect Ratio Contacts," Semiconductor Equipment and Materials International, Semicon Korea, 3 pages.

Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf], *Materials Transactions*, 43(7): 1585-1592.
Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$ Thin Films by ALCVD™ Method for Diffusion Barriers in Metallization," *IITC Conference Report*, 3 pp.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
U.S. Appl. No. 14/502,817, filed Sep. 30, 2014, entitled "Tungsten Feature Fill".
US Final Office Action, dated Nov. 5, 2014, issued in U.S. Appl. No. 13/633,502.
US Office Action, dated Dec. 11, 2014, issued in U.S. Appl. No. 14/173,733.
US Office Action, dated Jan. 15, 2015, issued in U.S. Appl. No. 13/774,350.
US Office Action, dated Dec. 23, 2014, issued in U.S. Appl. No. 13/851,885.
US Office Action, dated Dec. 18, 2014, issued in U.S. Appl. No. 14/502,817.
US Office Action, dated Sep. 18, 2014, issued in U.S. Appl. No. 13/928,216.
US Notice of Allowance, dated Nov. 4, 2014, issued in U.S. Appl. No. 13/560,688.
Chinese Fourth Office Action dated Jan. 5, 2015 issued in Application No. 200980133560.1.
PCT International Premliminary Report on Patentability and Written Opinion, dated Oct. 9, 2014, issued in PCT/US2013/033174.
PCT International Premliminary Report on Patentability and Written Opinion, dated Oct. 9, 2014, issued in PCT/US2013/034167.

* cited by examiner

CVD BASED METAL/SEMICONDUCTOR OHMIC CONTACT FOR HIGH VOLUME MANUFACTURING APPLICATIONS

FIELD OF THE INVENTION

This disclosure generally relates to forming an interconnect structure in a semiconductor device, such as a transistor device. Certain aspects of this disclosure pertain to forming an ohmic contact by depositing an interfacial dielectric between a metal and semiconductor in the source and drain regions of the semiconductor device.

BACKGROUND

In integrated circuit (IC) manufacturing, semiconductor devices such as the transistors are fabricated on a silicon substrate and then connected together to perform the desired circuit functions. This connection process is generally called "metallization", and can be performed using a number of photolithographic patterning, etching, and deposition steps.

To form the connections, metallization layers include vias and interconnect structures that function as electrical pathways to interconnect the semiconductor devices. In the metallization layers, the interconnect structures and vias form a contact with the substrate to form a metal-semiconductor contact. However, direct metal to semiconductor contact may be highly resistive. As devices scale smaller and smaller, such resistivity can be highly undesirable.

SUMMARY

This disclosure pertains to a method and apparatus for manufacturing an interconnect structure in a semiconductor device. The method can include providing the semiconductor device, such as a transistor. The semiconductor device includes a substrate, a gate dielectric over the substrate, a gate electrode over the gate dielectric, and source and drain regions in the substrate and on laterally opposite sides of the gate electrode. In certain implementations, a method can proceed by depositing by chemical vapor deposition (CVD) an interfacial dielectric over the source and drain regions of the substrate, depositing a pre-metal dielectric over the interfacial dielectric, forming one or more vias through the pre-metal dielectric over the source and drain regions of the substrate, and depositing by CVD a metal over the interfacial dielectric. In other implementations, a method can proceed by depositing a pre-metal dielectric over the substrate, forming one or more vias through the pre-metal dielectric over the source and drain regions of the substrate, depositing by CVD an interfacial dielectric over the source and drain regions of the substrate, and depositing by CVD a metal over the interfacial dielectric. In some embodiments, the method can further include depositing a barrier, adhesion, or nucleation layer by CVD between the metal and the interfacial dielectric.

This disclosure also pertains to an apparatus, such as an integrated process tool, with a controller configured with instructions for performing the aforementioned operations. In some aspects, the apparatus can include a wafer stepper. In some aspects, the apparatus can include modules for cleaning as well as modules for performing deposition steps, including deposition by CVD of the metal and/or interfacial dielectric. The deposition by CVD steps and/or the cleaning steps may be performed in an integrated process tool without introducing a vacuum break. In some embodiments, the cleaning step can be a chemical oxide removal step prior to depositing the interfacial dielectric.

In some embodiments, the interfacial dielectric is configured to unpin the metal Fermi level from the source or drain regions of the substrate. In some embodiments, the interfacial dielectric has a thickness between about 3 Å and about 20 Å. In some embodiments, the interfacial dielectric can include at least one of titanium oxide, strontium titanium oxide, zinc oxide, tantalum oxide, lanthanum oxide, zinc sulfide, zinc selenide, germanium oxide, cadmium oxide, and tin oxide. In some embodiments, the interfacial dielectric has an energy bandgap of greater than about 2.0 eV.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Although the present invention may be used in a variety of applications, one very useful application is in transistors, such as metal oxide semiconductor (MOS) field-effect transistors. MOS transistors can include two types: negative channel metal oxide semiconductor (NMOS) transistors and positive channel metal oxide semiconductor (PMOS) transistors. The transistors and other devices may be interconnected using interconnect structures to form. ICs.

Figure 1:
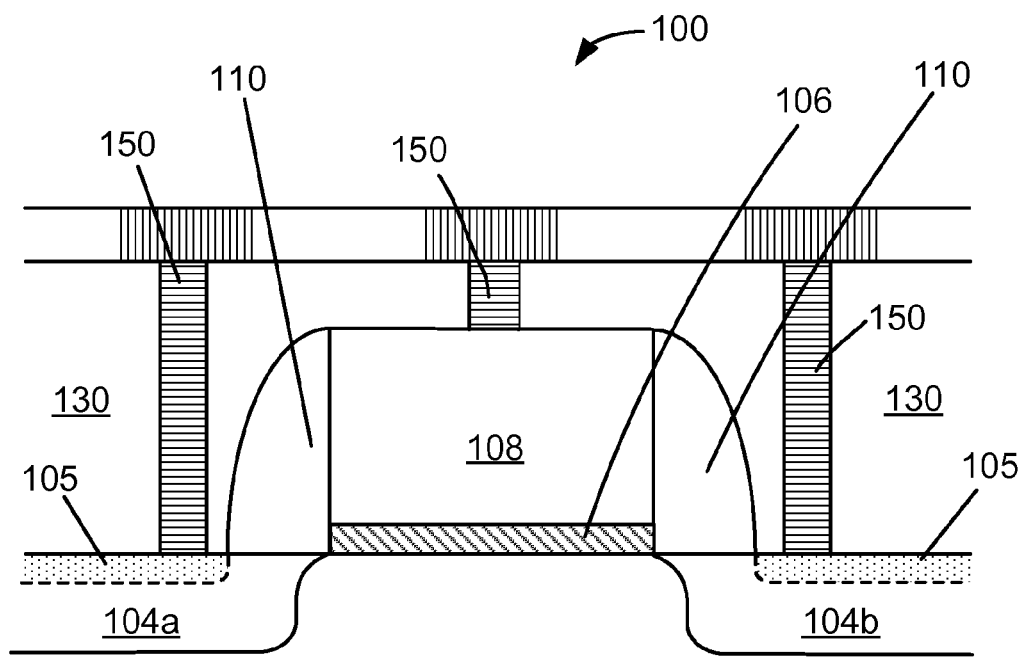
FIG. 1 shows a cross-section schematic view of a conventional semiconductor device, such as a transistor device, with a suicide.

FIG. 1 shows a cross-section schematic view of a transistor with silicide layers. The transistor 100 can be formed on a substrate 102, which is typically made of a semiconducting material, such as silicon. The transistor 100 includes a gate dielectric 106, a gate electrode 108, spacers 110, source region 104a, and drain region 104b. A pre-metal dielectric (PMD) layer 130 is formed over the transistor 100 and the substrate 102. Vias are formed within the PMD layer 130 and filled electrically conductive material, such as tungsten. The electrically conductive material in the vias form electrical contacts 150 that electrically connect with the gate electrode 108 as well as the source and drain regions 104a and 104b of the substrate 102. To enhance the electrical connection, silicide layers 105 are formed on the surface of the source and drain regions 104a and 104b, as illustrated in FIG. 1. The silicide layers 105 reduce the electrical resistance between the electrical contacts 150 and the source and drain regions 104a and 104b.

The metal-semiconductor junction between the electrical contacts 150 and the source and drain regions 104a and 104b of the substrate 102 create a Schottky barrier. The Schottky barrier enables high switching speeds and low voltage drops compared to a p-n junction. A Schottky barrier contact that does not rectify current may be referred to as an ohmic contact. Electrical resistance in an ohmic contact can be reduced by forming a silicide or germanide at the metal-semiconductor interface of the Schottky barrier.

Forming a silicide or germanide between the metal and the semiconductor can require several steps. First, the surface of the substrate 102 may be pre-cleaned prior to deposition of any metals to form the silicide or germanide. Next, a metal may be deposited over the source and drain regions 104a and 104b of the substrate 102. The metals can include any metal that is capable of reacting with silicon or germanium to form a silicide or germanide layer 105, respectively. Examples of such metals include titanium (Ti), tantalum (Ta), tungsten (W), cobalt (Co), nickel (Ni), platinum (Pt), palladium (Pd), and alloys thereof. Deposition of the metals can be achieved using conventional deposition techniques, such as chemical vapor deposition (CVD), physical vapor deposition (PVD), sputtering, evaporation, plating, and the like. Then, the metal may be annealed to form the silicide or germanide layers 105 using annealing techniques such as rapid thermal processing (RTP) anneal or laser anneal. The annealing can be performed at a temperature between about 300° C. and about 3000° C. Upon formation of the silicide after annealing, unreacted metal portions may be etched away using conventional etching techniques. Any of these steps may be repeated to form the silicide or germanide layers 105.

The aforementioned steps can significantly add to the cost and complexity of processing in forming an interconnect structure. Moreover, as semiconductor devices get smaller and smaller, there is less semiconductor material available to form a silicide and germanide. It is also possible for the formation of a silicide and germanide to impart strain on the semiconductor device.

Figure 2A:
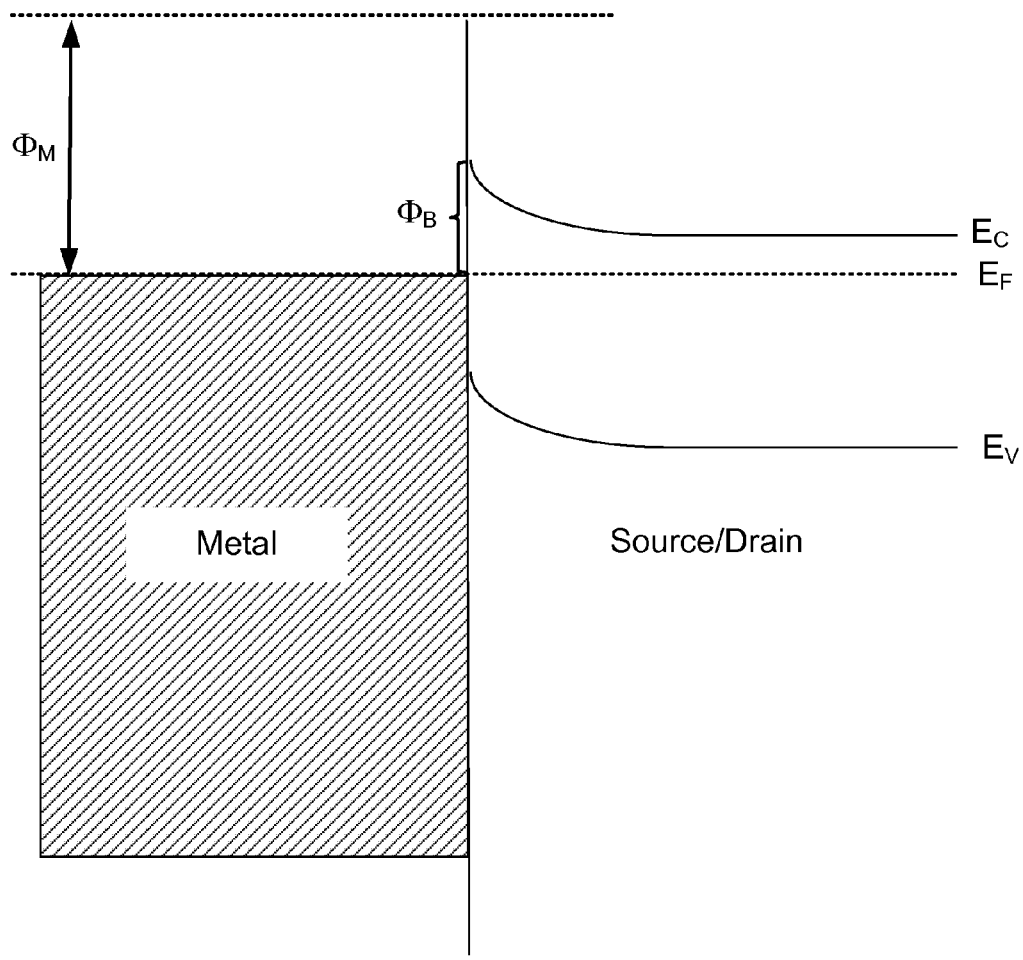
FIG. 2A shows an energy band diagram for a metal-semiconductor interface.

When a metal is electrically in contact with a semiconductor, the work required to go from the metal Fermi level to the carrier band edge of the semiconductor can describe the Schottky barrier height $\Phi_B$. The Schottky barrier height $\Phi_B$ is directly proportional with the contact resistance at the metal-semiconductor interface. FIG. 2A shows an energy band diagram for a metal-semiconductor interface. In FIG. 2A, $E_F$ represents the Fermi level, $E_C$ represents the conduction band minimum of the semiconductor, and $E_V$ represents the valence band maximum of the semiconductor. In a metal, the Fermi level is at the top of the metal's valence band. The work required to remove an electron from the metal Fermi level to the surface of the metal is the metal work function $\Phi_M$. In a semiconductor, the Fermi level is positioned in the band gap between $E_C$ and $E_V$ depending on the doping. In an n-doped semiconductor, the semiconductor Fermi level is typically positioned closer to the semiconductor conduction band $E_C$. In a p-doped semiconductor, the semiconductor Fermi level is typically positioned closer to the semiconductor valence band $E_V$. Generally, when a metal comes in contact with a semiconductor, the Fermi levels for the metal and semiconductor arrive at equilibrium such that a Fermi level is "pinned" in the band gap of the semiconductor. For n-type silicon in contact with a metal, for example, the Fermi level can be pinned near the conduction band minimum of the semiconductor as illustrated in FIG. 2A.

Figure 2B:
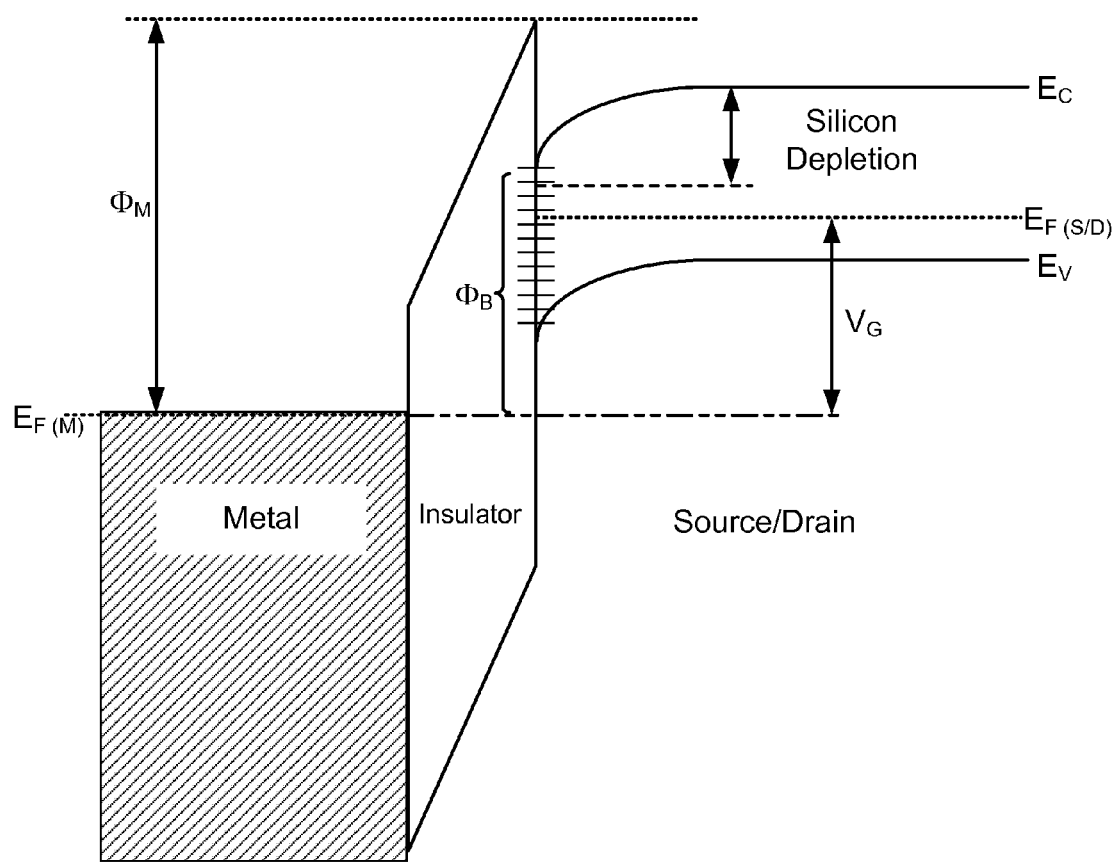
FIG. 2B shows an energy band diagram for a metal-semiconductor interface with an insulator between a metal and a semiconductor.

Introduction of a silicide or germanide layer is one approach that can reduce the Schottky barrier height $\Phi_B$. However, the Schottky barrier height $\Phi_B$ can be reduced only to a certain extent because of the effect of Fermi level pinning FIG. 2B shows an energy band diagram for a metal-semiconductor interface with an insulator between a metal and a semiconductor. The introduction of an insulating layer between a metal and a semiconductor in a metal-semiconductor junction can reduce or even eliminate the effects of Fermi level pinning. As illustrated in FIG. 2B, the metal Fermi level $E_{F(M)}$ is offset from the semiconductor Fermi level $E_{F(S/D)}$ by a voltage gap $V_G$. Thus, the metal Fermi level $E_{F(M)}$ is not pinned by the semiconductor Fermi level $E_{F(S/D)}$. The Schottky barrier height $\Phi_B$ can be reduced by decreasing the offset of the conduction band $E_C$ with the metal Fermi level $E_{F(M)}$. By unpinning the metal Fermi level from the source and drain regions of the semiconductor, the Schottky barrier height $\Phi_B$ can be tuned. This can result in decreased contact resistance that can lead to optimized transistor performance. This removes the need of forming silicide or germanide, and substantially reduces the cost and complexity of processing steps in forming an interconnect structure.

Figure 3:
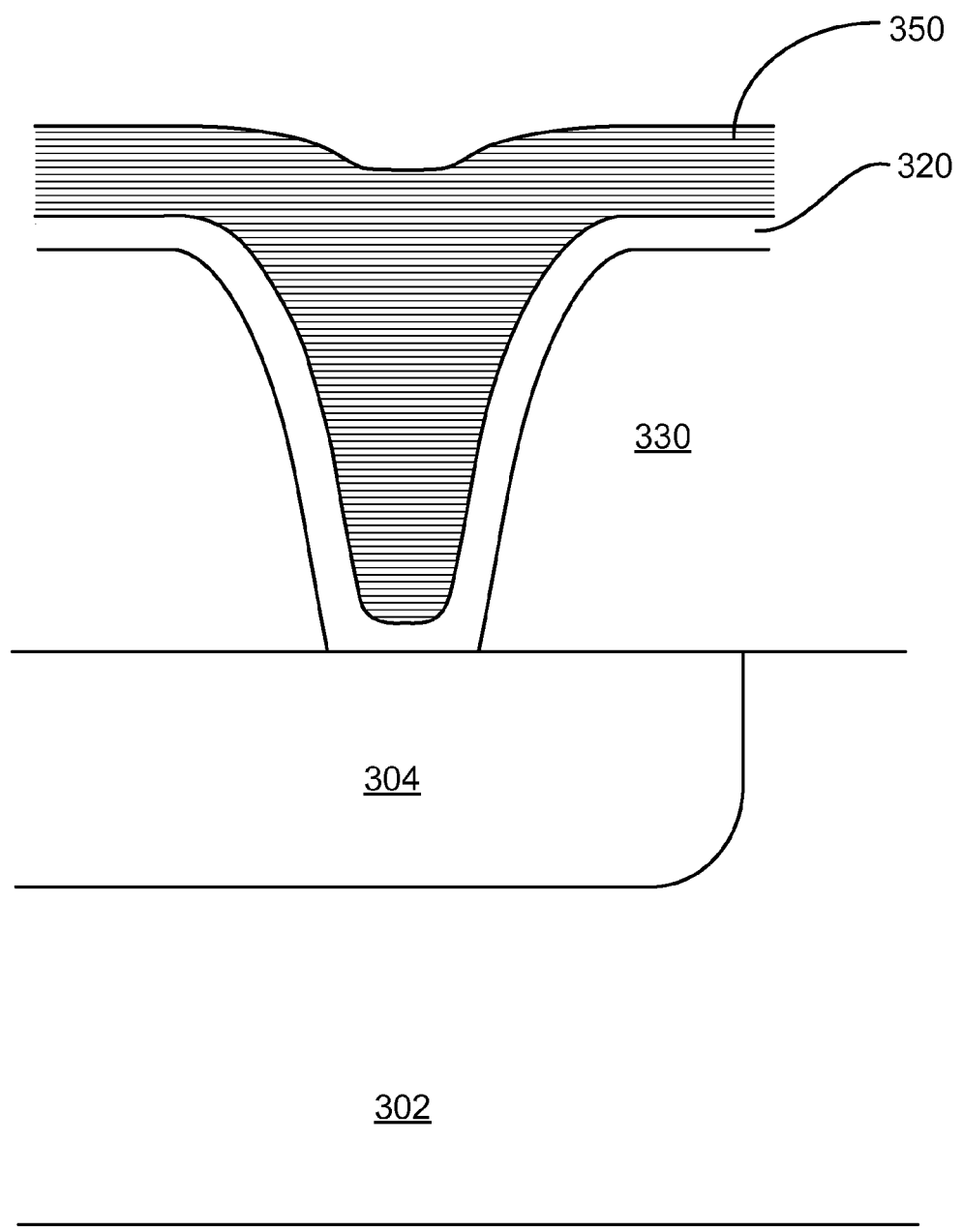
FIG. 3 shows a magnified cross-section schematic view of an interconnect structure at a source/drain region of a semiconductor device.

FIG. 3 shows a magnified cross-section schematic view of an interconnect structure at a source/drain region of a semiconductor device, such as a transistor device. The transistor device includes an interfacial dielectric layer 320 that is formed between a source/drain region 304 of a substrate 302 and a metal layer 350. The metal layer 350 forms part an interconnect structure of that may electrically connect the transistor device with other devices in an IC. Even though the metal layer 350 is not in direct contact with the source/drain regions 304 of the substrate 302, the metal layer 350 still forms an electrical contact with the source/drain regions 304 of the substrate 302. To form the metal layer 350, a via may be formed in a pre-metal dielectric (PMD) layer 330 and then filled with a metal, such as tungsten.

The interfacial dielectric layer 320 may be formed of any insulating material, such as a dielectric material. The dielectric material can include at least one of hafnium oxide ($HfO_2$), aluminum oxide ($Al_2O_3$), zirconium oxide ($ZrO_2$), silicon nitride ($Si_3N_4$), silicon oxide ($SiO_2$), silicon oxynitride (SiON), titanium oxide ($TiO_2$), strontium titanium oxide ($SrTiO_3$), zinc oxide (ZnO), tantalum oxide ($Ta_2O_5$), lanthanum oxide ($La_2O_3$), zinc sulfide (ZnS), zinc selenide (ZnSe), germanium oxide ($GeO_2$), cadmium oxide (CdO), tin oxide ($SnO_2$), and other suitable insulating dielectric materials. The choice of the dielectric material may have a sufficiently high energy bandgap so that the insulator itself does not pin the metal Fermi level. For example, the dielectric material can have an energy bandgap that is greater than about 2.0 eV. In addition, the choice of the dielectric material may have a sufficiently high dielectric constant. For example, the dielectric material can have a dielectric constant greater than about 5, such as between about 5 and 300. In some embodiments, the dielectric material may be selected so that an electron effective mass is relatively low. For example, the dielectric material can have an electron effective mass of less than about 0.7.

The thickness of the interfacial dielectric layer 320 may be chosen to unpin the metal Fermi level from the source/drain regions 304 of the substrate 302. As a result, the thickness of the insulating layer 320 may be very thin. For example, the thickness of the interfacial dielectric layer 320 may be less than about 50 Å, such as between about 3 Å and about 20 Å, or such as between about 5 Å and about 10 Å. Without being limited by theory, the thickness of the interfacial dielectric layer may be tuned to balance the effects of resistance associated with the Schottky barrier and the resistance associated with electron tunneling.

Therefore, the composition and thickness of the interfacial dielectric layer 320 may be tuned to control the Schottky barrier height $\Phi_B$ of a metal-semiconductor interface. By controlling the Schottky barrier height $\Phi_B$, transistor performance may be controlled. The interconnect structure as described with respect to FIG. 3 does not include a suicide or germanide.

Process

A method of manufacturing an interconnect structure to provide an ohmic contact at a metal-semiconductor interface for a semiconductor device is provided. The method includes providing a semiconductor device, such as a transistor, that includes a gate dielectric, a gate electrode, and source and drain regions in a substrate. The substrate can include a semiconducting material, such as silicon. An interfacial dielectric may be deposited by CVD over the source and drain regions. As used herein, CVD can include any number of CVD processes practiced in a variety of different formats as is known in the art. For example, deposition by CVD can include a metal organic chemical vapor deposition (MOCVD) process in which the CVD process is based on metal organic precursors. As used herein, CVD can also refer to processes in which one or more vapor phase reactants are introduced into a deposition chamber for reaction or decomposition. For the purposes of this document, this includes CVD processes in which reactants are introduced simultaneously to the chamber and/or are in the vapor phase simultaneously in the chamber, as well as surface-mediated processes in which reactants are introduced sequentially. The latter may include atomic layer deposition (ALL)) and conformal film deposition (CFD) reactions. According to various implementations, the CVD processes may be thermal or plasma-enhanced, and can include plasma-enhanced CVD (PECVD) and plasma-enhanced ALD (PEALD) processes. Examples of CFD processes for depositing dielectric material can be described in U.S. application Ser. No. 13/084,399, U.S. application Ser. No. 13/084,305, and U.S. application Ser. No. 13/242,084, each incorporated by reference in its entirety and for all purposes.

The interfacial dielectric may have a thickness and composition that unpins the metal Fermi level from the source and drain regions of the substrate. Other materials and layers may be deposited also by CVD in manufacturing the interconnect structure, including depositing by CVD a pre-metal dielectric (PMD) layer and/or a metal layer. For example, the interfacial dielectric and the metal layer may be deposited without a vacuum break (e.g., air break). An air break can introduce oxidation into the semiconductor device, which can lead to higher electrical resistance and decreased transistor performance. In some embodiments, the interconnect structure may be manufactured in an integrated process tool, described in more detail below.

Figure 4:
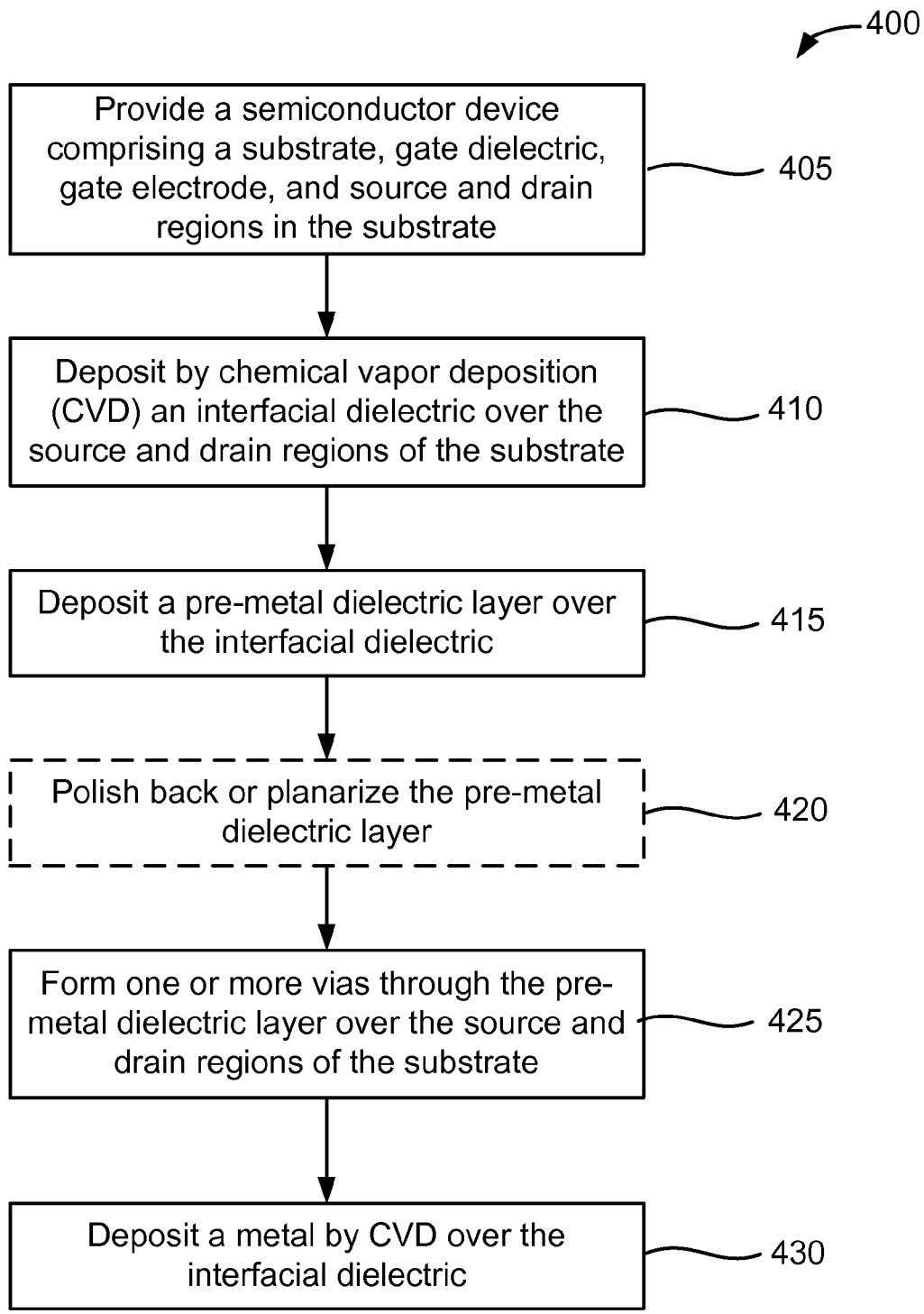
FIG. 4 shows an exemplary flow diagram illustrating a method of manufacturing an interconnect structure of a semiconductor device.

FIG. 4 shows an exemplary flow diagram illustrating a method of manufacturing an interconnect structure of a semiconductor device. FIGS. 5A-5F show cross-section schematic views of various stages in a method of manufacturing an interconnect structure of a semiconductor device, according to the flow diagram in FIG. 4. Each of the steps discussed in FIG. 4 will be discussed with respect to corresponding cross-section schematic views in FIGS. 5A-5F.

In FIG. 4, the process 400 begins with step 405 where a semiconductor device is provided. The semiconductor device includes a substrate, a gate dielectric formed over the substrate, a gate electrode formed over the gate dielectric, and source and drain regions in the substrate and on laterally opposite sides of the gate electrode. The semiconductor device can be a transistor device, such as a MOS field-effect transistor device.

Figure 5A:
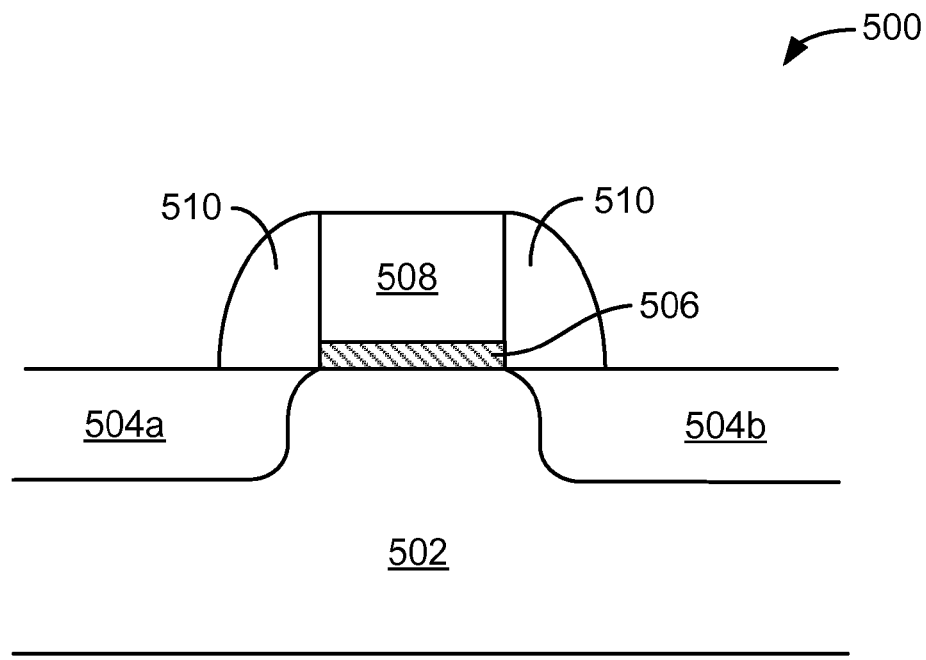
FIGS. 5A-5F show cross-section schematic views of various stages in a method of manufacturing an interconnect structure of a semiconductor device, according to some implementations.

FIG. 5A shows an example of a cross-section schematic view of a semiconductor device 500, such as a transistor device. The semiconductor device 500 includes a substrate 502. The substrate 502 can include any semiconducting material, such as silicon, germanium, indium antimonide, lead telluride, indium arsenide, indium phosphide, gallium arsenide, and gallium antimonide, among others. In some embodiments, the substrate 502 may be formed using bulk silicon, or a silicon-on-insulator (SOI) structure. However, it is understood that any semiconductor structures as is well known in the art may be used for the substrate 502.

The semiconductor device 500 also includes a gate dielectric 506 over the substrate 502, and a gate electrode 508 over the gate dielectric 506. Source and drain regions 504a and 504b may be formed in the substrate 502 and on laterally opposite sides of the gate dielectric 506. In some embodiments, the source and drain regions 504a and 504b may be n-doped or p-doped, using doping processes as is known in the art. Spacers 510 may be formed on laterally opposite sides of the gate dielectric 506 and over the substrate 502.

The process 400 continues with step 410 where an interfacial dielectric is deposited by CND over the source and drain regions of the substrate. The interfacial dielectric may be conformally deposited over the semiconductor device and form a relatively thin layer of dielectric material. The interfacial dielectric may be selected to have a thickness and a composition to unpin a metal Fermi level from the source and drain regions of the substrate.

In some implementations, step 410 may include additional process operations. For example, prior to depositing the interfacial dielectric, the substrate surface may be cleaned. A wet cleaning or a dry plasma process may be used to remove unwanted contaminants and residue. Such processes may be used alone or in combination with each other. Afterwards, the interfacial dielectric may be deposited over a surface of the substrate that is substantially clean. Deposition of the interfacial dielectric and the cleaning step may be performed in an integrated apparatus without introducing a vacuum break.

In some implementations, the cleaning of the substrate surface may be accomplished using a chemical oxide removal. One exemplary process can include introducing hydrofluoric acid (HF) and ammonia ($NH_3$) to interact with a native oxide (such as $SiO_2$) and form a solid reaction product (such as ammonium hexafluorosilicate). As the reaction proceeds, the native oxide is consumed and the solid reaction product increases in thickness to form a diffusion barrier against the HF and the $NH_3$. Thus, the chemical oxide removal process is a self-limiting process even as the time is increased.

After consuming the native oxide and forming the solid reaction product, the solid reaction product is sublimated at elevated temperatures. The substrate can be heated to an elevated temperature, such as between about 80° C. and about 150° C. to sublimate the solid reaction product. The chemical oxide removal process reduces edge roughness and provides substantially uniform "etching" on the substrate surface.

Figure 5B:
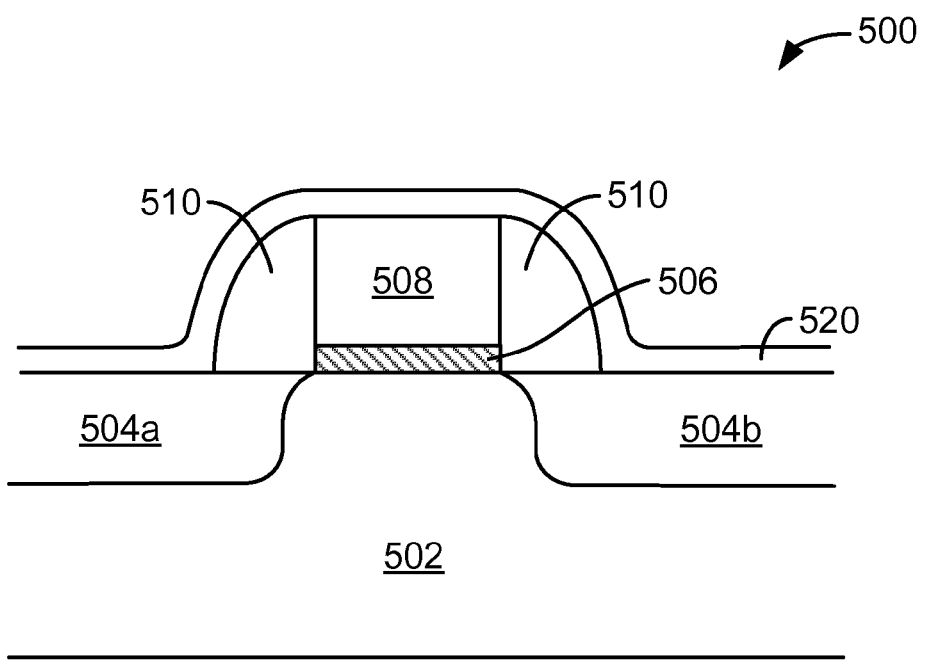

FIG. 5B shows an example of a cross-section schematic view of the partially fabricated interconnect structure (up through step 410) of the semiconductor device 500. In FIG. 5B, an interfacial dielectric 520 is conformal over the source and drain regions 504a and 504b of the substrate 502, over the spacers 510, and over the gate electrode 508. The interfacial dielectric 520 can include a dielectric material such as $HfO_2$, $Al_2O_3$, $ZrO_2$, $Si_3N_4$, $SiO_2$, SiON, $TiO_2$, $SrTiO_3$, ZnO, $Ta_2O_5$, $La_2O_3$, ZnS, ZnSe, $GeO_2$, CdO, and $SnO_2$. The thickness of the interfacial dielectric 520 can be less than about 50 Å, such as between about 3 Å and about 20 Å, and such as between about 5 Å and about 10 Å.

Returning to FIG. 4, the process 400 continues at step 415 where a PMD layer is deposited over the interfacial dielectric. The PMD layer may be deposited over the interfacial dielectric using any conventional deposition method known in the art. In some implementations, deposition by CVD of both the PMD layer and the interfacial dielectric can be performed without introducing a vacuum break.

Figure 5C:
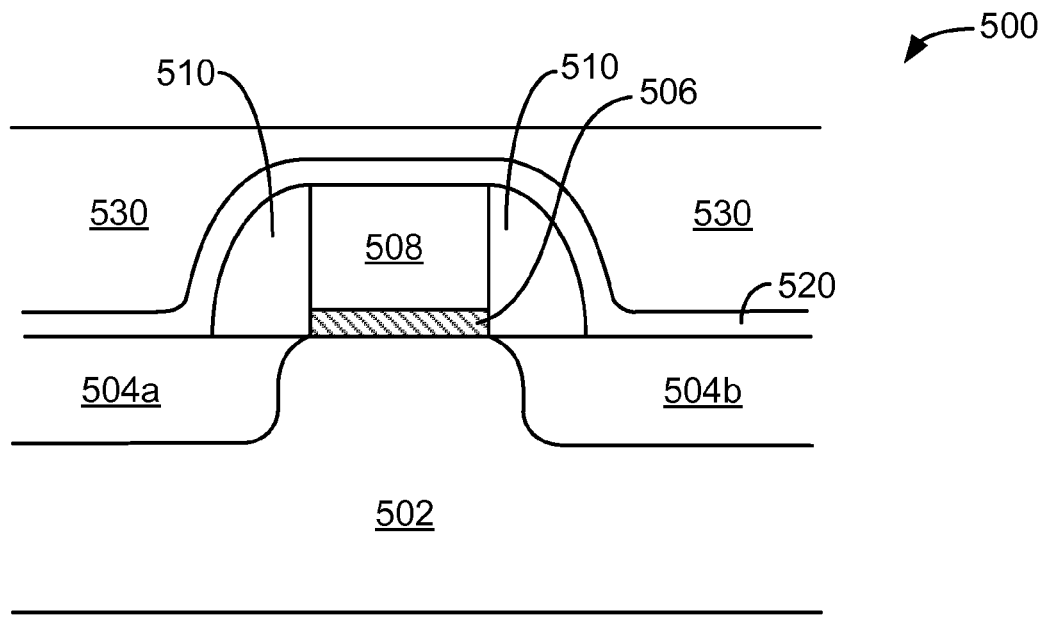

FIG. 5C shows an example of a cross-section schematic view of the partially fabricated interconnect structure (up through step 415) of the semiconductor device 500. FIG. 5C shows a thick layer of a PMD layer 530 deposited over the interfacial dielectric 520. In some instances, the PMD layer 530 may also be referred to as an interlayer dielectric (ILD) layer. The PMD layer 530 may be formed of any dielectric material. In some embodiments, the dielectric material can have a relatively low dielectric constant. Examples of dielectric materials can include silicon oxide ($SiO_2$), carbon doped oxide (CDO), silicon nitride ($Si_3N_4$), polymers such as perfluorocyclobutane (PFCB) and polytetrafluoroethylene (PTFE), fluorosilicate glass (FSG), and organosilicate glass. The PMD layer 530 may include pores or other voids to further reduce its dielectric constant.

Returning to FIG. 4, the process 400 continues at step 420 where the PMD layer is optionally polished back or planarized. In some embodiments, the PMD layer and the interfacial dielectric are subjected to chemical mechanical planarization (CMP) until a top surface of the gate electrode is exposed. The PMD layer and the interfacial dielectric may be over-polished to sufficiently expose the gate electrode.

Figure 5D:
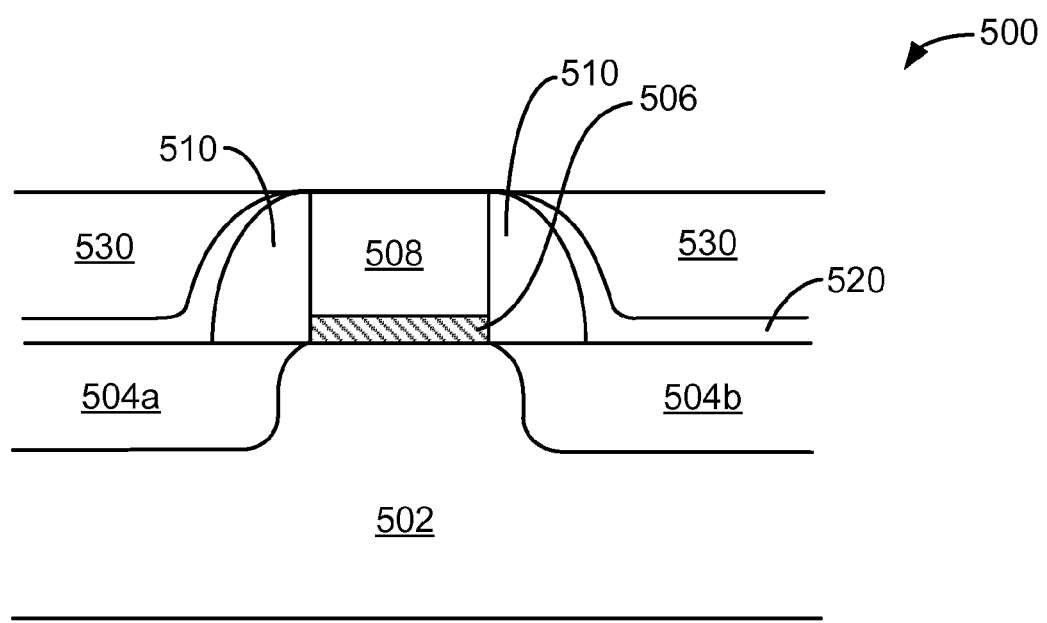

FIG. 5D shows an example of a cross-section schematic view of the partially fabricated interconnect structure (up through step 420) of the semiconductor device 500. In FIG. 5D, the semiconductor device 500 shows the top surface of the gate electrode exposed after polishing and/or planarizing the PMD layer 530 and the interfacial dielectric 520.

Returning to FIG. 4, the process 400 continues at step 425 where one or more vias are formed through the PMD layer over the source and drain regions of the substrate. Vias may be formed in the PMD layer using methods known in the art, such as etching, photolithography, laser drilling, sandblasting, and the like.

Figure 5E:
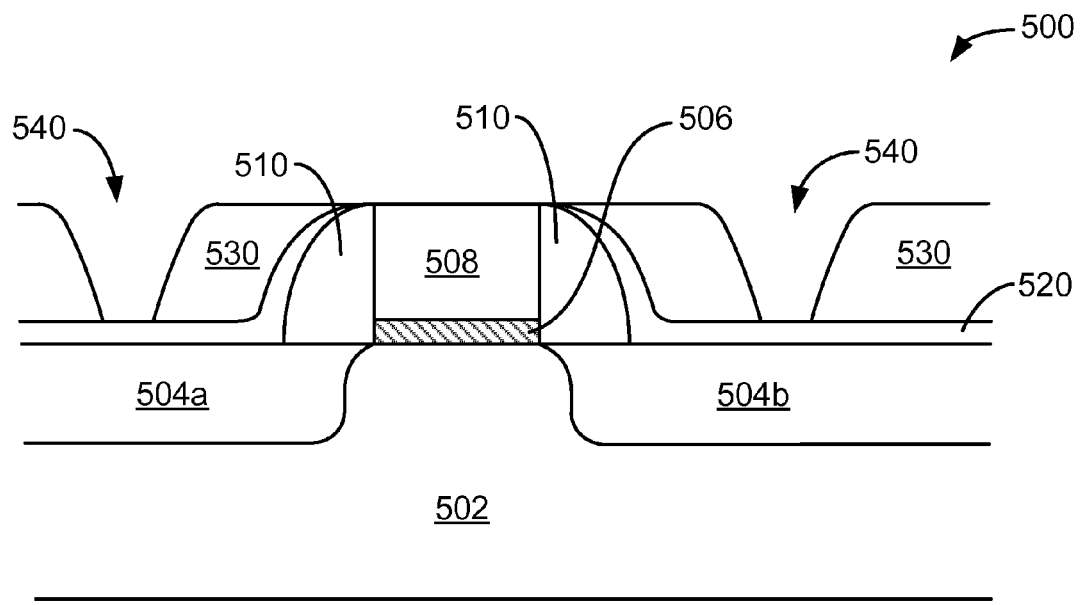

FIG. 5E shows an example of a cross-section schematic view of the partially fabricated interconnect structure (up through step 425) of the semiconductor device 500. As illustrated in FIG. 5E, at least two vias 540 are formed through the PMD layer 530 to expose a top surface of the interfacial dielectric 520. The vias 540 are formed over the source and drain regions 504a and 504b of the substrate 502. The vias 540 may be formed through the PMD layer 530 having various shapes and sizes. In some implementations, the vias 540 may have a tapered sidewall contour or a linear sidewall contour. In some implementations, the vias 540 may have a height to width aspect ratio of about 1.5:1 or greater.

The vias 540 are formed through the PMD layer 530 up to the interfacial dielectric 520. In some embodiments, the interfacial dielectric 520 serves as an etch stop layer. Instead of depositing a separate etch stop layer over the substrate 502 or using the substrate 502 itself as an etch stop, the interfacial dielectric 520 may function as an etch stop during formation of the vias 540 since many dielectric materials typically have highly selective etch chemistries.

Returning to FIG. 4, the process 400 continues at step 430 where a metal is deposited over the interfacial dielectric. In some implementations, the metal can be deposited over the interfacial dielectric by CVD. The deposition of the metal over the interfacial dielectric at least partially fills the one or more vias to form an electrical contact. In some embodiments, the deposition of the metal substantially fills the one or more vias to form the electrical contact. The electrical contact may be part of an interconnect structure that connects the transistor device with other devices in an IC.

In some implementations, prior to depositing the metal over the interfacial dielectric, additional layers may be deposited over the interfacial dielectric. Such layers may include barrier, nucleation, and/or seed layers. Each of these layers may be formed using a conventional deposition method known in the art, such as CVD, and may each serve multiple functions. In some embodiments, the barrier layer may limit the diffusion of metal atoms into the interfacial dielectric and the PMD layer. In some embodiments, the adhesive layer may serve to promote the adhesion of metal onto the interfacial dielectric. In some embodiments, the nucleation layer may promote the nucleation of bulk metal over the interfacial dielectric.

The thickness of the adhesive, barrier, or nucleation layer may be relatively thin, such as less than about 500 Å. Materials for the adhesive, barrier, or nucleation layer can include but is not limited to ruthenium (Ru), rhodium (Rh), Pd, Ni, Co, Pt, Ti, Ta, W, titanium nitride (TiN), tantalum nitride (TaN), tungsten nitride (WN), zirconium (Zr), and hafnium (Hf). For example, a barrier layer over the interfacial dielectric can include TiN or WN. In some embodiments, the adhesive, barrier, or nucleation layer can include multiple layers of materials, such as combinations of some of the materials listed above.

Figure 5F:
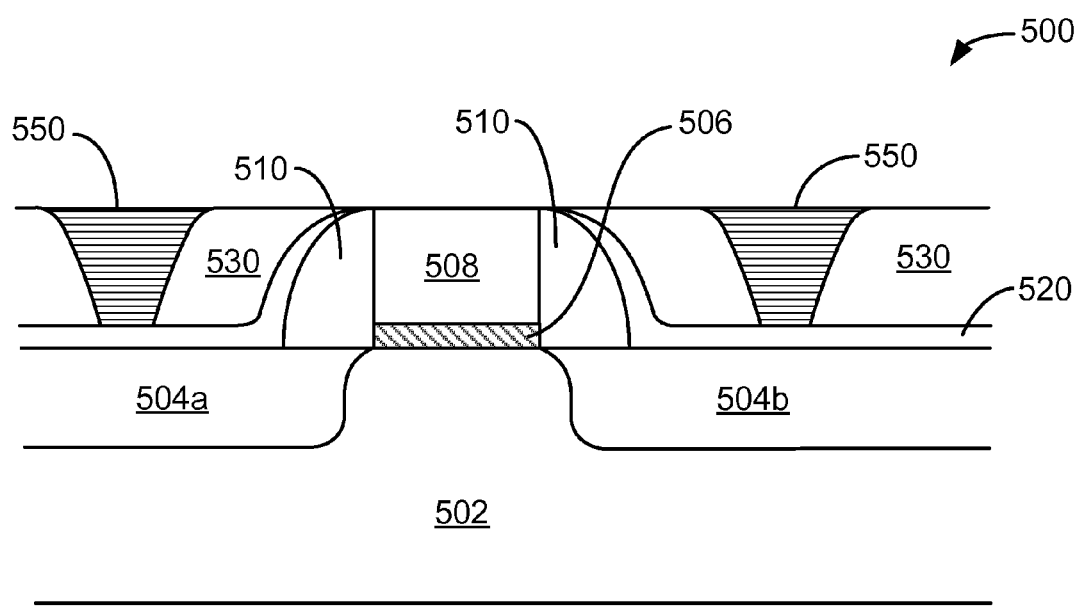

In FIG. 5F, a metal 550 is deposited over the interfacial dielectric 520 and substantially fills the vias 540. The thickness of the metal 550 can be deposited to substantially or completely fill each of the vias 540. The metal 550 can include various metals, such as copper (Cu), magnesium (Mg), aluminum (Al), W, Ru, Pd, Co, Ni, Ti, Ta, TiN, TaN, Hf, and Zr. The deposition of metal may be followed by a polishing or planarizing process to remove any excess metal.

In some implementations, the metal 550 includes W and forms a tungsten plug as an electrical contact. Formation of a tungsten plug may provide a low resistivity electrical contact. In some instances, the tungsten plug may be formed by depositing a thin barrier layer of WN, and then depositing bulk W to fill the via 540. The thin barrier layer of WN may be deposited using a pulsed nucleation layer (PNL) technique, and the bulk W may be deposited using CVD or a combination of PNL deposition and CVD. A description of depositing WN by a PNL process is described in U.S. Pat. No. 7,005,372, which is herein incorporated by reference for all purposes. In some instances, the tungsten plug may be formed by depositing bulk W into the via 540 without a nucleation layer. A description of depositing bulk W by CVD without a nucleation layer is described in U.S. patent application Ser. No. 13/560,688, which is herein incorporated by reference for all purposes. In some instances, the tungsten plug can be formed using a deposition-etch-deposition process to at least substantially fill the via 540 with W. A description of such a technique is described in U.S. Patent Publication No. 2012/0009785, which is herein incorporated by reference for all purposes.

Figure 6:
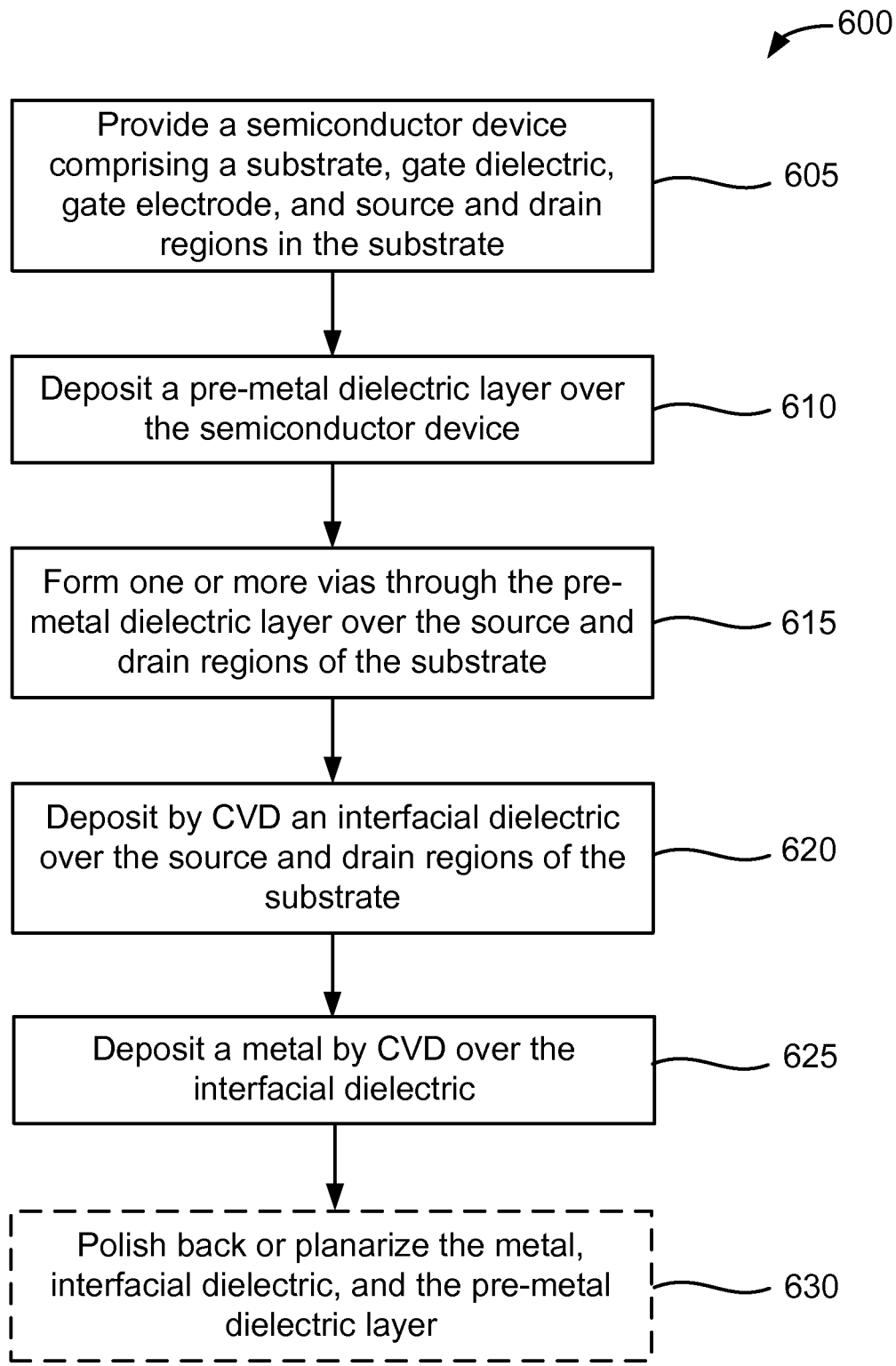
FIG. 6 shows an exemplary flow diagram illustrating a method of manufacturing an interconnect structure of a semiconductor device.

FIG. 6 shows an exemplary flow diagram illustrating a method of manufacturing an interconnect structure of a semiconductor device. FIGS. 7A-7F show cross-section schematic views of various stages in a method of manufacturing an interconnect structure of a semiconductor device, according to the flow diagram of FIG. 6. Each of the steps discussed in FIG. 6 will be discussed with respect to corresponding cross-section schematic views in FIGS. 7A-7F.

Figure 7A:
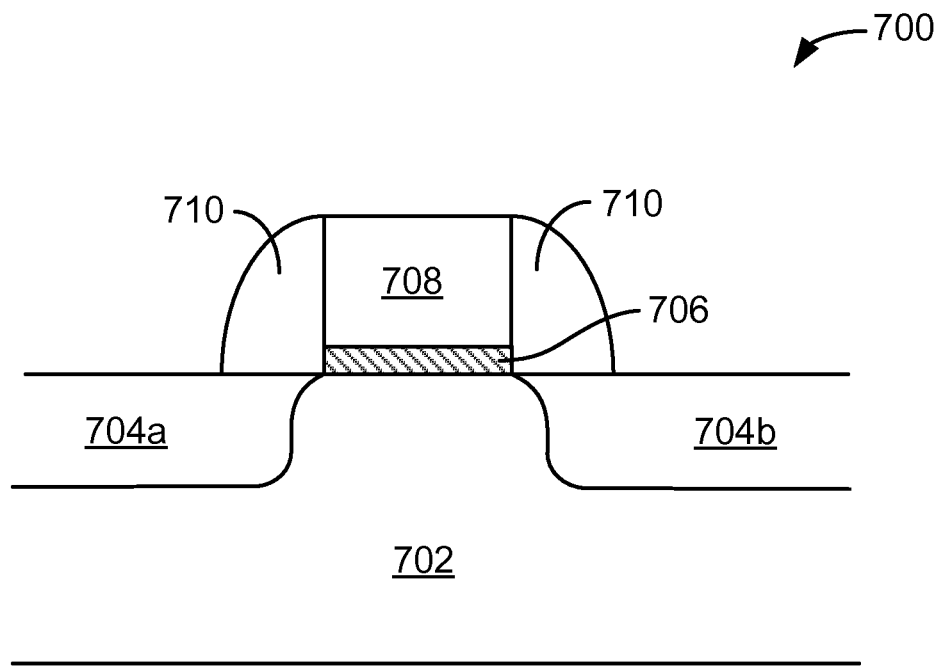
FIGS. 7A-7F show cross-section schematic views of various stages in a method of manufacturing an interconnect structure of a semiconductor device, according to some implementations.

In FIG. 6, the process 600 begins with step 605 where a semiconductor device is provided, s generally described above at step 405 of the process 400. FIG. 7A shows an example of a cross-section schematic view of a semiconductor device 700, which can be similar to the semiconductor device 500 as illustrated in FIG. 5A.

The process 600 continues with step 610, where a PMD layer is deposited over the semiconductor device. Hence, deposition of the PMD layer may occur prior to the deposition of an interfacial dielectric. In some instances, an etch stop may be formed over the substrate prior to the deposition of the PMD layer. Step 610 may be similar to step 415 in the process 400.

Figure 7B:
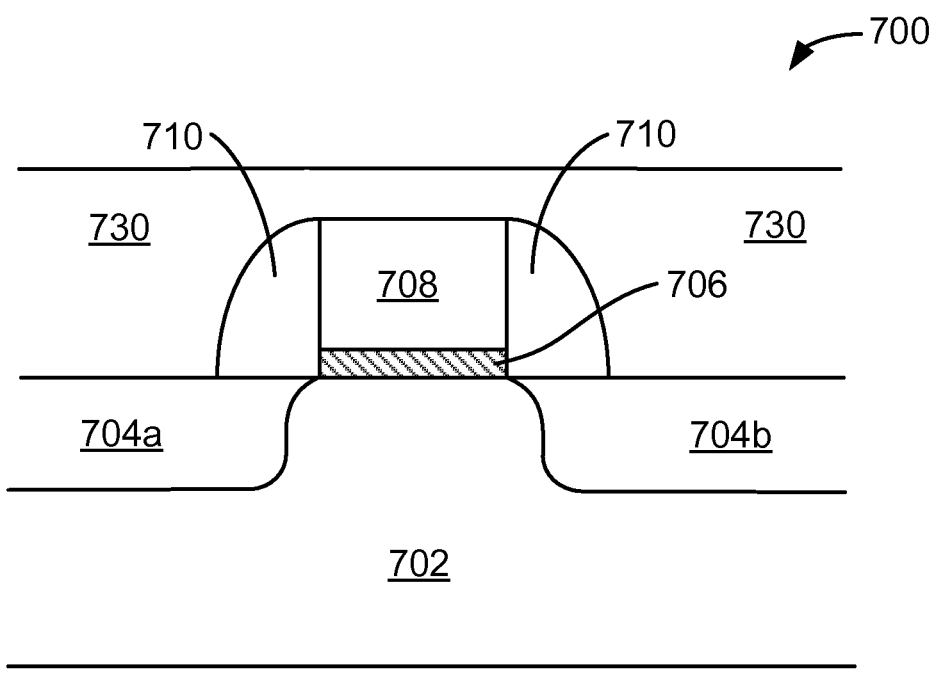

FIG. 7B shows an example of a cross-section schematic view of the partially fabricated interconnect structure (up through step 610) of the semiconductor device. Aspects of the PMD layer 730 may be similar to the PMD layer 530 described with respect to FIG. 5C, including its composition, thickness, and other properties. Here, the PMD layer 730 is formed over the substrate 702, the spacers 710, and the gate electrode 708 without being separated by an interfacial dielectric.

The process 600 continues with step 615, where one or more vias are formed through the PMD layer over the source and drain regions of the substrate. Step 615 may be similar to step 425 in the process 400. In some embodiments, the removal of material from the PMD layer to form the one or more vias may require an etch stop over the substrate. In some embodiments, the substrate may not require an etch stop, such as in instances where the etchant is sufficiently selective to the PMD material over the substrate material.

Figure 7C:
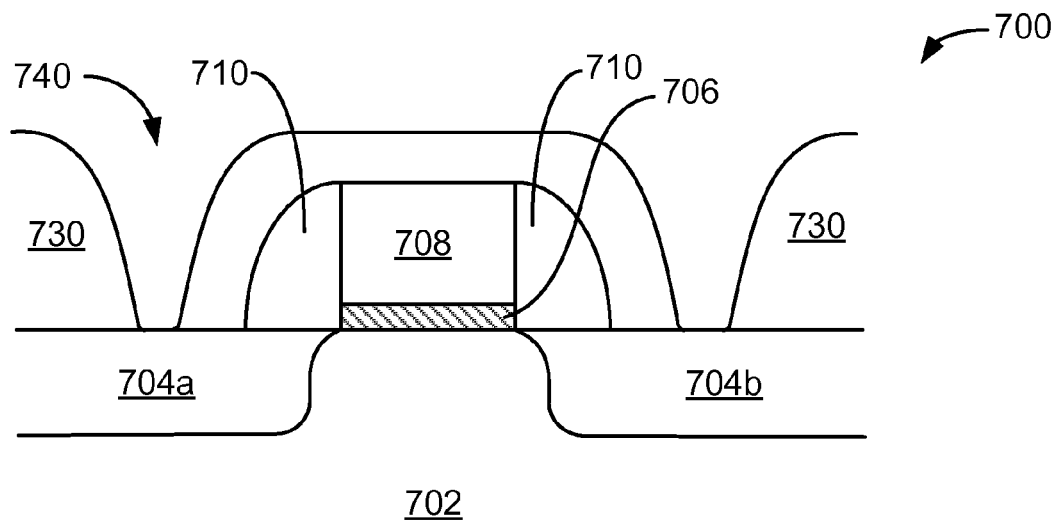

FIG. 7C shows an example of a cross-section schematic view of the partially fabricated interconnect structure (up through step 615) of the semiconductor device. At least two vias 740 are formed through the PMI) layer 730 to expose top surfaces of the source and drain regions 704a and 704b. Aspects of the vias 740 may be similar to the vias 540 described with respect to FIG. 5E.

Returning to FIG. 6, the process 600 continues with step 620, where an interfacial dielectric is deposited by CVD over the source and drain regions of the substrate. The interfacial dielectric may be conformally deposited in the one or more vias and along the top surfaces of the PMD layer. Step 620 may be similar to step 410 in the process 400, which may include an additional cleaning step prior to the deposition of the interfacial dielectric, as discussed above. The additional cleaning step may be performed with the deposition of the interfacial dielectric without introducing a vacuum break.

Figure 7D:
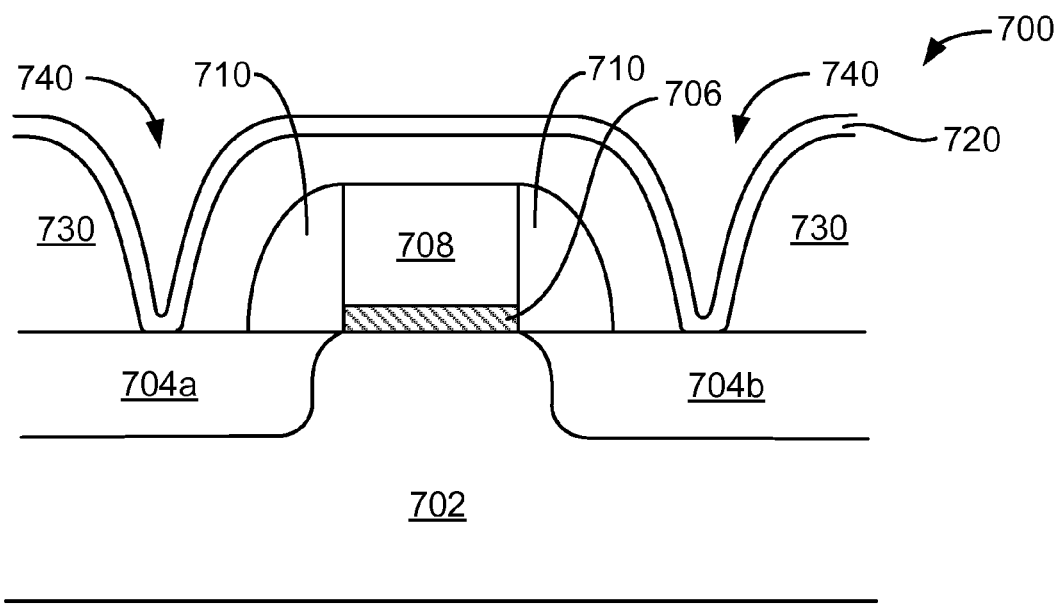

FIG. 7D shows an example of a cross-section schematic view of the partially fabricated interconnect structure (up through step 620) of the semiconductor device. An interfacial dielectric 720 is conformal along the sidewalk of the vias 740 and along the top surfaces of the PMD layer 730. Aspects of the interfacial dielectric 720 may be similar to the interfacial dielectric 520 described with respect to FIG. 5B, including its composition, thickness, and other properties. The interfacial dielectric 720 may be selected to have a thickness and a composition to unpin a metal Fermi level from the source and drain regions 704a and 704b of the substrate 702.

Returning to FIG. 6, the process 600 continues with step 625 where a metal is deposited by CVD over the interfacial dielectric. Deposition of the metal and the interfacial dielectric occur by CVD such that the deposition steps may be performed without a vacuum break. In some embodiments, the cleaning of the substrate surface, the deposition of the metal, and the deposition of the interfacial dielectric occur without introducing a vacuum break. In some embodiments, one or more adhesion, barrier, and/or nucleation layers may be deposited over the interfacial dielectric prior to depositing the metal. In some embodiments, the adhesion, barrier, or nucleation layer may also be deposited by CVD. Step 625 may be similar to step 430 in the process 400 as discussed above.

Figure 7E:
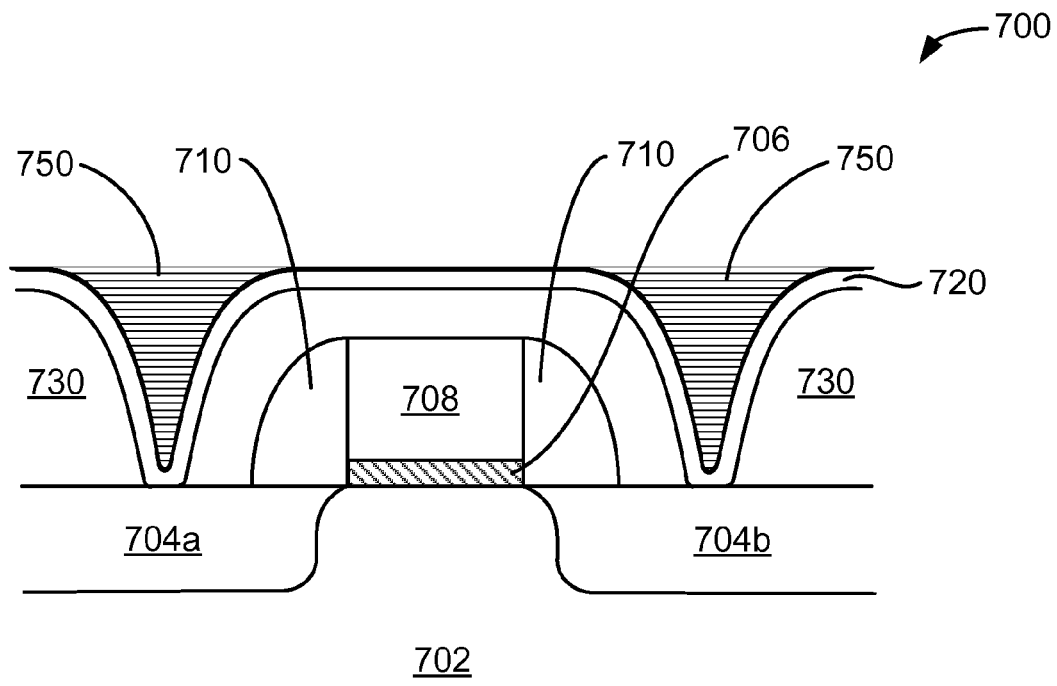

FIG. 7E shows an example of a cross-section schematic view of the partially fabricated interconnect structure (up through step 625) of the semiconductor device. In FIG. 7E, a metal 750 at least substantially fills the vias 740 to form an electrical contact. The metal 750 is formed over the source and drain regions 704a and 704b of the substrate 702, with the interfacial dielectric 720 in between the metal 750 and the source and drain regions 704a and 704b. No silicide or germanide is formed with the electrical contact. In some embodiments, the metal 650 includes W. Aspects of the metal 750 may be similar to the metal 550 in FIG. 5F, including its composition, thickness, and other properties.

Returning to FIG. 6, the process 600 continues at step 630 where the metal, the interfacial dielectric, and the PMD layer is optionally polished back or planarized. In some implementations, the metal, the interfacial dielectric, and the PMD layer is subjected to CMP to expose the gate electrode. It is understood that the polishing or planarizing step may occur before deposition of the interfacial dielectric and the metal. The PMD layer may be over-polished to sufficiently expose the gate electrode. In some other implementations, an additional via may be formed over the gate electrode to expose the gate electrode.

Figure 7F:
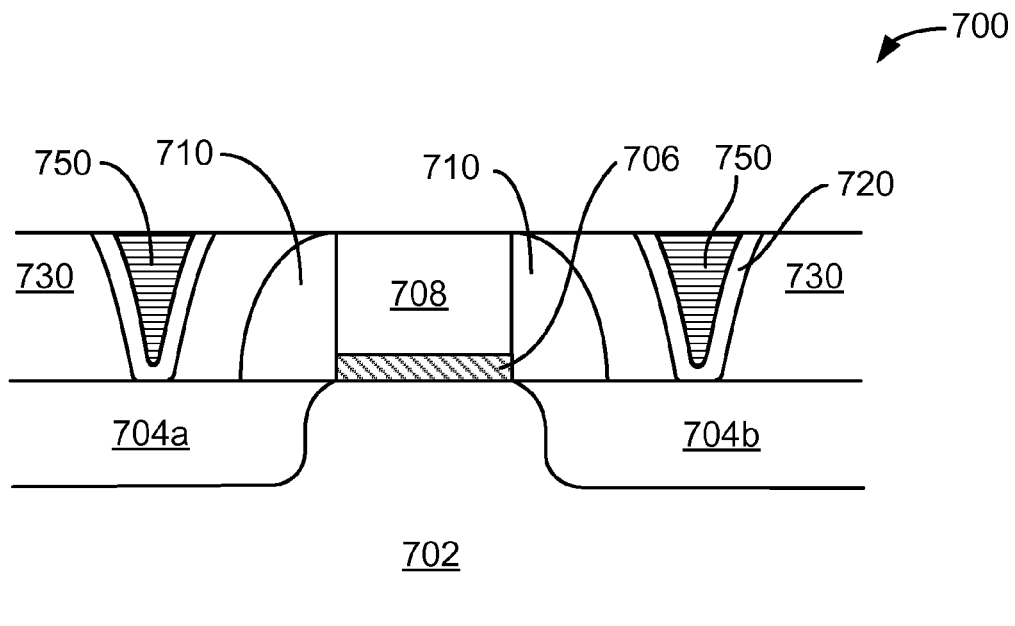

FIG. 7F shows an example of a cross-section schematic view of the fabricated interconnect structure (up through step 630) of the semiconductor device. In FIG. 7F, the semiconductor device 700 shows the top surface of the gate electrode 708 exposed after polishing/planarizing the metal 750, the interfacial dielectric 720, and the PMD layer 730.

In FIG. 4, depositing by CVD the interfacial dielectric occurs before depositing the PMD layer and before forming the one or more vias through the PMD layer. In FIG. 6, depositing by CVD the interfacial dielectric occurs after forming the one or more vias through the PMD layer. However, in the implementations as described above, with respect to FIGS. 4, 5A-5F, 6, and 7A-7F, the sequence of operations need not be performed in the order as described.

Apparatus

The methods presented herein may be carried out in various types of deposition apparatuses available from various vendors. Examples of a suitable apparatus include a Novellus Concept-1 ALTUS™, a Concept 2 ALTUS™, a Concept-2 ALTUS-S™, Concept 3 ALTUS™ deposition system, and ALTUS Max™ or any of a variety of other commercially available CVD tools. In some cases, the process can be performed on multiple deposition stations sequentially. A description can be found in, for example, U.S. Pat. No. 6,143,082, which is incorporated herein by reference for all purposes.

In some embodiments, each of the CVD processes occurring at different steps may be performed in a single chamber, or within a single chamber having multiple deposition stations. Thus, each of the deposition steps for a PMD layer, an interfacial dielectric, a barrier layer, an adhesion layer, a nucleation layer, and/or a metal may be performed in a single chamber or integrated process tool. Such an arrangement can avoid having to introduce a vacuum break or otherwise transfer the substrate to another chamber or process tool.

In some embodiments, where a soaking or cleaning step occurs before any one of the CVD processes, chemical solvents, reducing agents, acids, and other liquids or gases relevant to the soaking or cleaning step can be first introduced to the surface of the substrate at a first station. Then a second station may be used to complete a CVD process, such as for depositing tungsten. In such embodiments, a tungsten-containing precursor and hydrogen gas at a high partial pressure are introduced to the surface of the feature using an individual gas supply system that creates a localized atmosphere at the substrate surface. Alternatively, the soaking or cleaning treatment step as well as the CVD process can occur in the same chamber or same station, and the apparatus may be configured to change the relevant chemical species introduced into the chamber or station.

In some embodiments, where a plasma treatment step occurs before any one of the CVD processes, an inert gas containing plasma, corresponding carrier gases, and other gases are introduced to the surface of the substrate at a first station. Then the substrate may be optionally transferred to a CVD station or chamber to complete a CVD process. For example, to complete a CVD process for depositing metal, a tungsten-containing precursor, hydrogen gas, and potentially other carrier gases are introduced to the surface of the feature using an individual gas supply system that creates a localized atmosphere at the substrate surface.

In some embodiments, a downstream plasma apparatus including a plasma generator may be used. A showerhead or other gas inlet can separate the plasma generator and an exposure area of a treatment chamber. Sources of gas provide a flow of gas into the plasma generator. In some embodiments, the plasma generator includes induction coils connected to a power source. During operation, gas mixtures are introduced into the plasma generator, with induction coils energized, and plasma is generated in the plasma generator. In embodiments in which a showerhead assembly is used, the assembly may have an applied voltage. The assembly may terminate the flow of some or substantially all ions and allow the flow of neutral species such as radicals into the treatment chamber. In some embodiments, the plasma is created by flowing gas through an inductively coupled source in which the plasma acts as the secondary in a transformer. An example of this type of remote plasma source is the Astron®, manufactured by MKS Instruments of Wilmington, Mass. Reactive species can be produced within the plasma and transported to a chamber which contains the substrate. In some embodiments, ionic species are not introduced from the remote plasma source.

In some embodiments, each CVD process may be performed in one of two, four, five, or even more deposition stations positioned within a single chamber or apparatus. Process gases for each of the CVD processes may be introduced to the surface of the substrate at a station using an individual gas supply system that creates a localized atmosphere at the substrate surface.

Figure 8:
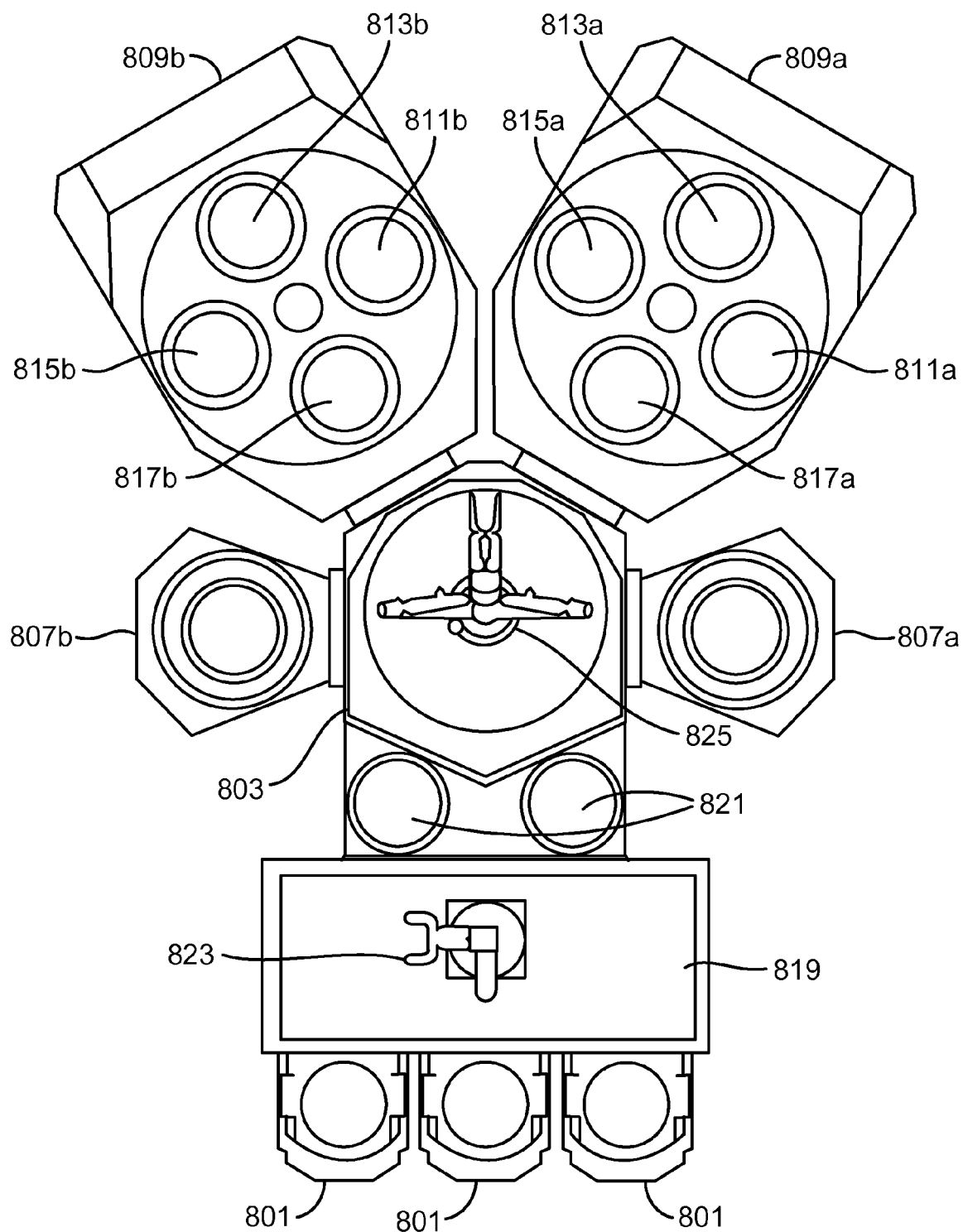
FIG. 8 shows a top view schematic of a processing system for manufacturing an interconnect structure of a semiconductor device.

FIG. 8 shows a top view schematic of a processing system for manufacturing an interconnect structure of a semiconductor device. In FIG. 8, a block diagram for a processing system 800 with multiple deposition stations may be configured to perform multiple processes. Some of the CND processes and/or cleaning steps may be performed without a vacuum break. In some embodiments, the processing system 800 is an integrated processing tool.

Figure 9:
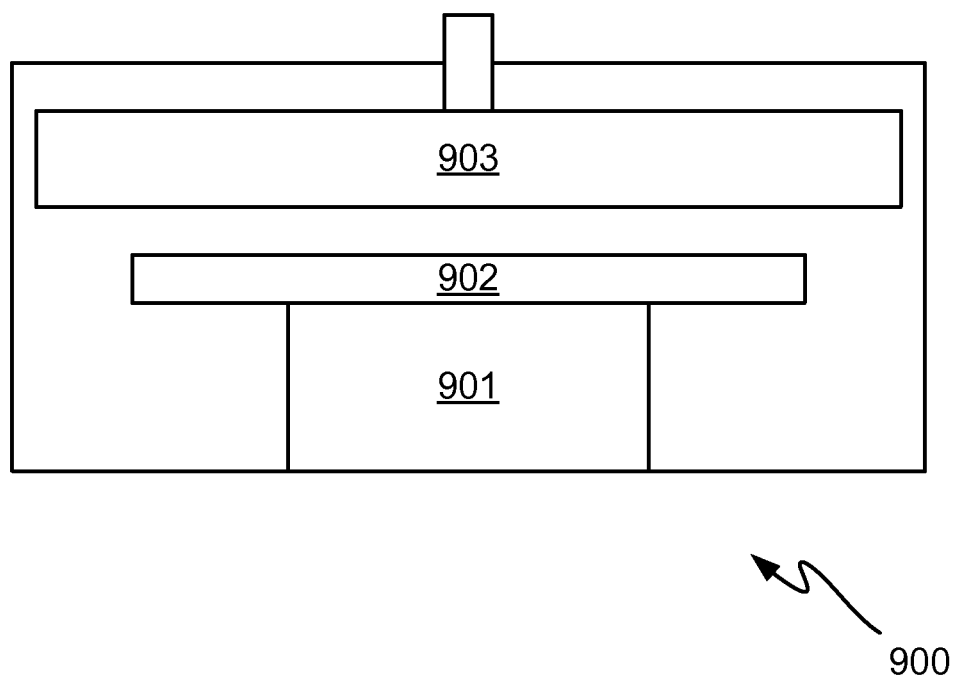
FIG. 9 shows a side view schematic of a deposition station for a processing system.

The processing system 800 includes a transfer module 803. The transfer module 803 provides a clean, pressurized environment to minimize the risk of contamination of substrates being processed as they are moved between the various reactor modules. Mounted on the transfer module 803 is a multi-station chamber 809 capable of performing substrate soaking/cleaning, plasma treatment, liner layer deposition if desired, and CVD, according to some embodiments. Chambers 809a and 809b may include multiple stations 811a, 813a, 815a, 817a, 811b, 813b, 813c, and 813d that may sequentially perform these operations. For example, chamber 809a could be configured such that station 811a performs soaking, station 813a performs liner layer deposition, and stations 815a and 817a perform CVD, such as CVD of an interfacial dielectric layer. Chamber 809b could be configured such that station 811b performs soaking, station 813b performs liner layer deposition, and stations 815b and 817b perform CVD, such as CVD of a metal. In some implementations, deposition by CVD of the interfacial dielectric and the metal may occur together in the same chamber, such as either chamber 809a or 809b. Each deposition station may include a heated substrate pedestal and a showerhead, dispersion plate or other gas inlet. An example of a deposition station 900 is depicted in FIG. 9, including wafer support 902 and showerhead 903. A heater may be provided in pedestal portion 901. The apparatus in FIG. 9 also depicts an example of a chamber if certain steps of the some embodiments are carried out in chambers within a single module 807.

Also mounted on the transfer module 803 may be one or more single or multi-station modules 807a or 807b capable of performing a cleaning step, such as a chemical oxide removal. The module 807a or 807b may also be used for various other treatments, e.g., WN or other liner layer deposition or post-liner WN CVD. The processing system 800 also includes one or more (in this case, two) substrate source modules 801 where substrates are stored before and after processing. An atmospheric robot 823 in the atmospheric transfer chamber 819 first removes substrates from the source modules 801 to load locks 821. A substrate transfer device 825, such as a robot arm unit, in the transfer module 803 moves the substrates from the load locks 821 to and among the modules 807a and 807b mounted on the transfer module 803. Thus, the processing system 800 may perform the aforementioned processes, including cleaning, deposition by CVD of the interfacial dielectric, and deposition by CVD of the metal, in the same tool without introducing a vacuum break.

In certain embodiments, a system controller 829 is employed to control process conditions during deposition. The controller will typically include one or more memory devices and one or more processors. The processor may include a CPU or computer, analog and/or digital input/output connections, stepper motor controller boards, etc.

The controller 829 may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions, such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of some embodiments in a single or multi-chamber semiconductor processing tool.

In some embodiments, the controller 829 may be configured with instructions for performing the operations described earlier herein. The controller 829 may include instructions for receiving a semiconductor device, wherein the semiconductor device includes a substrate, a gate dielectric over the substrate, a gate electrode over the dielectric, and source and drain regions in the substrate and on laterally opposite sides of the gate electrode. The controller 829 also includes instructions for depositing by CVD an interfacial dielectric over the source and drain regions of the substrate, depositing a PMD layer over the semiconductor device, forming one or more vias through the PMD layer over the source and drain regions of the substrate, and depositing by CVD a metal over the interfacial dielectric. In some implementations, some of the deposition steps by CVD can occur in at least one or a plurality of deposition stations.

In some embodiments, the controller 829 includes instructions for depositing the interfacial dielectric before depositing the PMD layer and before forming the one or more vias through the PMD layer. In some embodiments, the controller 829 includes instructions for depositing the interfacial dielectric after forming the one or more vias through the PMD layer. In some embodiments, the controller 829 includes instructions for depositing a barrier, adhesion, or nucleation layer by CVD between the metal and the interfacial dielectric. For example, a barrier layer can include at least one of WN and TiN. In some embodiments, the interfacial dielectric is configured to unpin the metal Fermi level from the source and drain regions of the substrate.

The apparatus/process described herein above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. An integrated process tool apparatus comprising:
  a controller configured with instructions for performing the following operations:
    (a) receiving a semiconductor device, wherein the semiconductor device comprises:
      a substrate;
      a gate dielectric over the substrate;
      a gate electrode over the gate dielectric; and
      source and drain regions in the substrate and on laterally opposite sides of the gate electrode;
    (b) depositing by chemical vapor deposition (CVD) an interfacial dielectric over the source and drain regions of the substrate;
    (c) depositing a pre-metal dielectric over the semiconductor device;
    (d) forming one or more vias through the pre-metal dielectric over the source and drain regions of the substrate, wherein the interfacial dielectric is an etch stop in forming the one or more vias; and (e) depositing by CVD a metal over the interfacial dielectric to fill the one or more vias, wherein the controller comprises instructions for depositing the interfacial dielectric before depositing the pre-metal dielectric and before forming the one or more vias through the pre-metal dielectric.

2. The integrated process tool apparatus of claim 1, wherein the metal comprises tungsten.

3. The integrated process tool apparatus of claim 1, wherein the interfacial dielectric has a thickness between about 3 Å and about 20 Å.

4. The integrated process tool apparatus of claim 1, wherein the controller further comprises instructions for depositing an intervening layer by CVD between the metal and the interfacial dielectric, the intervening layer comprising a barrier, adhesion, or nucleation layer.

5. The integrated process tool apparatus of claim 1 wherein the controller further comprises instructions for cleaning the semiconducting device prior to depositing the interfacial dielectric.

6. The integrated process tool apparatus of claim 5, wherein the controller is configured to perform cleaning the semiconducting device and the deposition of the interfacial dielectric without introducing a vacuum break.

7. The integrated process tool apparatus of claim 1 wherein the interfacial dielectric comprises at least one of titanium oxide, strontium titanium oxide, zinc oxide, tantalum oxide, lanthanum oxide, zinc sulfide, zinc selenide, germanium oxide, cadmium oxide, and tin oxide.

8. The integrated process tool apparatus of claim 1, wherein the interfacial dielectric has a thickness between about 5 Å and about 10 Å.

9. The integrated process tool apparatus of claim 1, wherein the interfacial dielectric has an energy bandgap of greater than about 2.0 eV.

10. The integrated process tool apparatus of claim 1, wherein the interfacial dielectric is configured to unpin the metal Fermi level from the source or drain regions of the substrate.

11. The integrated process tool apparatus of claim 1, further comprising a wafer stepper.

12. A method comprising:
providing a semiconductor device, comprising:
a substrate;
a gate dielectric formed over the substrate;
a gate electrode formed over the gate dielectric; and
source and drain regions in the substrate and on laterally opposite sides of the gate electrode;
depositing by chemical vapor deposition (CVD) ml interfacial dielectric over the source and drain regions of the substrate, wherein the interfacial dielectric is configured to unpin the metal Fermi level from the source or drain regions of the substrate;
depositing a pre-metal dielectric over the semiconductor device;
forming one or more vias through the pre-metal dielectric over the source and drain regions of the substrate, wherein the interfacial dielectric is an etch stop in forming the one or more vias; and
depositing by CVD a metal over the interfacial dielectric to fill the one or more vias, wherein the controller comprises instructions for depositing the interfacial dielectric before depositing the pre-metal dielectric and before forming the one or more vias through the pre-metal dielectric.

13. The method of claim 12, wherein the interfacial dielectric has a thickness between about 3 Å and about 20 Å.

14. The method of claim 12, further comprising:
depositing the intervening layer by CVD between the metal and the interfacial dielectric, the intervening layer comprising a barrier, adhesion, or nucleation layer.

15. The method of claim 14, wherein the barrier layer comprises tungsten nitride or titanium nitride.

16. The method of claim 12, wherein the metal and the interfacial dielectric form a contact with the source and drain regions of the semiconductor device, wherein the contact does not comprise silicide.

17. The method of claim 12, wherein the metal comprises tungsten.

18. The method of claim 12, wherein the interfacial dielectric comprises at least one of titanium oxide, strontium titanium oxide, zinc oxide, tantalum oxide, lanthanum oxide, zinc sulfide, zinc selenide, germanium oxide, cadmium oxide, and tin oxide.

19. The method of claim 12, wherein the interfacial dielectric has a dielectric constant of greater than 5.0.

20. The method of claim 12, wherein the interfacial dielectric has an energy bandgap of greater than about 2.0 eV.

21. The method of claim 12, further comprising:
before depositing the interfacial dielectric, cleaning the substrate in the source and the drain regions of the substrate by chemical oxide removal process.

22. The method of claim 21, wherein the cleaning the substrate and depositing by CVD the interfacial dielectric occurs without introducing a vacuum break.

23. The method of claim 12, further comprising:
planarizing the pre-metal dielectric by chemical mechanical planarization (CMP).

24. The method of claim 12, wherein deposition of the metal, the pre-metal dielectric, and an intervening layer between the metal and the interfacial dielectric occur by CVD without introducing a vacuum break.

25. The integrated process tool apparatus of claim 1, wherein deposition of the metal, the pre-metal dielectric, and an intervening layer between the metal and the interfacial dielectric occur by CVD without introducing a vacuum break.

* * * * *